(12) United States Patent
Minamide et al.

(10) Patent No.: US 8,563,200 B2
(45) Date of Patent: Oct. 22, 2013

(54) MANUFACTURING METHOD OF PHOTOMASK, METHOD FOR OPTICAL PROXIMITY CORRECTION, AND MANUFACTURING METHOD OF SEMICONDUCTOR DEVICE

(75) Inventors: Ayumi Minamide, Kanagawa (JP); Akemi Moniwa, Kanagawa (JP); Akira Imai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 37 days.

(21) Appl. No.: 13/345,367

(22) Filed: Jan. 6, 2012

(65) Prior Publication Data
US 2012/0183891 A1 Jul. 19, 2012

(30) Foreign Application Priority Data
Jan. 18, 2011 (JP) ................................ 2011-007839

(51) Int. Cl.
*G03F 1/20* (2012.01)
(52) U.S. Cl.
USPC ................. 430/5; 430/30; 430/296; 430/942; 716/53
(58) Field of Classification Search
USPC ........................... 430/5, 30, 296, 942; 716/53
See application file for complete search history.

(56) References Cited

U.S. PATENT DOCUMENTS 6,570,174 B1 5/2003 Tounai et al.

FOREIGN PATENT DOCUMENTS

JP 2000-181046 6/2000
JP 2002-258459 9/2002

*Primary Examiner* — Christopher Young
(74) *Attorney, Agent, or Firm* — McDermott Will & Emery LLP

(57) ABSTRACT

A manufacturing method of a photomask by which a resist pattern corresponding to a pattern with designed values can be formed, a method for optical proximity correction, and a manufacturing method of a semiconductor device are provided. Proximity design features that are close to each other and estimated to violate a mask rule check are extracted. In the proximity design features, correction prohibited regions where optical proximity correction is not carried out are set based on the distance between the features obtained from the extracted proximity design features and the resolution of an exposure device. Optical proximity correction is carried out on the proximity design features with the correction prohibited regions excluded to obtain corrected proximity patterns. A predetermined mask material is patterned by carrying out electron beam lithography based on the corrected proximity pattern data.

5 Claims, 23 Drawing Sheets

MANUFACTURING METHOD OF PHOTOMASK, METHOD FOR OPTICAL PROXIMITY CORRECTION, AND MANUFACTURING METHOD OF SEMICONDUCTOR DEVICE

CROSS-REFERENCE TO RELATED APPLICATIONS

The disclosure of Japanese Patent Application No. 2011-7839 filed on Jan. 18, 2011 including the specification, drawings and abstract is incorporated herein by reference in its entirety.

BACKGROUND

The present invention relates to manufacturing methods of photomasks, methods for optical proximity correction, and manufacturing methods of semiconductor devices and in particular to a manufacturing method of a photomask for forming hole features and line features, a method for optical proximity correction used to manufacture such a photomask, and a manufacturing method of a semiconductor device using this photomask.

In the manufacture of a semiconductor device, a semiconductor element, a wiring, or the like is formed by repeating the following steps: a step of forming a predetermined film, such as an insulating film or a conductive film, over a semiconductor substrate, a step of carrying out processing, such as etching, on the film, and the other like steps. Before this processing is carried out, a resist pattern is formed over a predetermined film by a lithography process. In the lithography process, it is important to form a desired resist pattern so that desired pattern dimensions and shape can be obtained by processing such as etching.

In conjunction with the microminiaturization of patterns, there is a tendency of the shape or dimensions of a resist pattern to deviate from the shape or dimensions of the pattern with designed values. When a photomask is manufactured, for this reason, processing is carried out to correct the data of the pattern of the photomask to make a resist pattern actually formed over a semiconductor substrate agree with a desired finished shape. This processing is designated as optical proximity correction (OPC).

A photomask pattern is determined based on data corrected by this optical proximity correction and there are model-based OPC and rule-based OPC as techniques therefor. In model-based OPC, a photomask pattern is determined by taking the following procedure: a design pattern is divided into small sides; each side is corrected by optical proximity correction built based on experimental values; an actually delineated resist pattern is estimated by shape simulation using the corrected pattern; and pattern deformation and shape simulation for the resist pattern are repeated until a desired resist pattern is obtained. In rule-based OPC, meanwhile, a photomask pattern is determined by correcting pattern data with designed values with a preset amount of correction for optical proximity correction.

A photomask is manufactured based on data of a photomask pattern finally determined as mentioned above. First, a resist film for electron beam exposure over a light shield film formed over the surface of a glass plate is scanned with an electron beam based on the data and a layout pattern is thereby drawn. Subsequently, the resist film for electron beam exposure is subjected to predetermined development and a resist pattern corresponding to the layout pattern is thereby formed. Subsequently, the light shield film is subjected to etching using the resist pattern as a mask and a photomask is thereby formed.

[Patent Document 1]
Japanese Unexamined Patent Publication No. 2000-181046
[Patent Document 2]
Japanese Unexamined Patent Publication No. 2002-258459

SUMMARY

As mentioned above, a photomask is manufactured by carrying out electron beam lithography based on data of a determined pattern. As the result of optical proximity correction being carried out, the opening size of a hole feature tends to be increased relative to pattern data with designed values, especially, in places where hole features are close to each other. In addition, the end portions of line features close to each other tend to be increased in size in places where the line features are close to each other. For this reason, in a photomask pattern that underwent optical proximity correction, hole features or the end portions of line features are further brought close to each other.

In places where features are too close to each other, the following may take place even though the features are positioned separately from each other by data: when electron beam lithography is carried out based on the data, features actually formed as a photomask bond to each other or cannot be accurately drawn. That is, an area where features are close to each other cannot be stably resolved.

To avoid these problems in advance, it is checked whether or not a photomask pattern that underwent optical proximity correction can be actually and stably formed as a photomask pattern based on the data of the pattern. This check is designated a mask rule check (MRC).

With respect to a place where it is determined by this mask rule check that patterns cannot be stably resolved into a photomask, the following processing is carried out: the edges of portions of the features are retreated so that the featrues are separated from each other to a distance at which they can be resolved or part of the features is trimmed. That is, the data on a photomask pattern so determined that a desired resist pattern is formed over a semiconductor substrate is changed with respect to part of the pattern before the photomask is made because of limitations imposed when the photomask is made. Examples of documents disclosed in this technical field include Patent Document 1 and Patent Document 2.

For this reason, the following may take place in photomasks made based on corrected data: for example, the size of a resist pattern over a semiconductor substrate is reduced and a desired resist pattern cannot be obtained. Since a resist pattern with a desired size and the like cannot be obtained, the following may take place: a sufficient depth of focus cannot be ensured and it is difficult to accurately resolve a pattern on resist applied to a stepped base material.

The invention has been made to solve the above problems. It is an object thereof to provide a manufacturing method of a photomask by which a resist pattern corresponding to a pattern with designed values can be formed over a semiconductor substrate. It is another object thereof to provide a method for optical proximity correction used in this manufacturing method of a photomask. It is further another object thereof to provide a manufacturing method of a semiconductor device to which such a photomask is applied.

A manufacturing method of a photomask of the invention is for photoengraving a predetermined pattern in a photosensitive material film over a semiconductor substrate and includes the following steps. At a step, proximity design features close to each other are extracted in a desired pattern with designed values. The proximity design features will be brought too close to each other when optical proximity correction is carried and cannot be stably resolved as a photomask pattern and are thus estimated to violate a mask rule check. At a step, correction prohibited regions in which optical proximity correction is not carried out are set in the proximity design features based on the following: the distance between the features obtained from the extracted proximity design features and a resolution obtained from the wavelength of the exposure light and the numerical aperture of an exposure device. At a step, the proximity design features are subjected to optical proximity correction with the correction prohibited regions excluded and corrected proximity features are thereby determined. At a step, electron beam lithography is carried out based on the corrected proximity patterns to pattern a predetermined mask material.

A method for optical proximity correction of the invention is for optical proximity correction applied to the manufacture of a photomask for photoengraving and includes the following steps. At a step, proximity design features close to each other are extracted in a desired pattern with designed values. The proximity design features will be brought too close to each other when optical proximity correction is carried out and cannot be stably resolved as a photomask pattern and are thus estimated to violate a mask rule check. At a step, correction prohibited regions in which optical proximity correction is not carried out are set in the proximity design features based on the following: the distance between the features obtained from the extracted proximity design features and a resolution obtained from the wavelength of the exposure light and the numerical aperture of an exposure device. At a step, the proximity design features are subjected to optical proximity correction with the correction prohibited regions excluded and corrected proximity features are thereby determined.

A manufacturing method of a semiconductor device of the invention includes the following steps. At a step, a film to be processed is formed over the main surface of a semiconductor substrate. At a step, the surface of the film to be processed is coated with resist. The resist is photoengraved using a photomask containing proximity photomask patterns close to each other. At a step, the photoengraved resist is subjected to development to form resist patterns corresponding to the proximity photomask patterns. At a step, the film to be processed is processed using the resist patterns as a mask and a film-to-be-processed pattern corresponding to the proximity photomask patterns is formed over the film to be processed.

The photomask used here is formed by taking the following procedure. Proximity design features that will be brought close to each other when optical proximity correction is carried out and cannot be stably resolved as a photomask pattern and are thus estimated to violate a mask rule check are extracted. Correction prohibited regions in which optical proximity correction is not carried out are set in the extracted proximity design features based on the following: the distance between the features obtained from the proximity design patterns and a resolution obtained from the wavelength of the exposure light and the numerical aperture of an exposure device. The proximity design features are subjected to optical proximity correction with the correction prohibited regions excluded and corrected proximity features are thereby obtained. Electron beam lithography is carried out based on the obtained corrected proximity pattern data.

According to the manufacturing method of a photomask or the method for optical proximity correction of the invention, a target patterning shape of a film to be processed can be obtained over a semiconductor substrate without violating a mask rule check. To do this, the following procedure is taken. Correction prohibited regions in which optical proximity correction is not carried out are set in the following patterns before optical proximity correction is carried out: features that are close to each other and estimated to violate a mask rule check after optical proximity correction is carried out. Then optical proximity correction is carried out.

In pattern correction having the same effect as mentioned above, the following can be implemented: in model-based OPC processing, initial divided side length can be made very small. In this case, however, the OPC processing calls for a huge amount of time and the amount of drawing data also becomes enormous. In addition, photomask drawing also calls for a huge amount of time. Therefore, this is not practical. In the invention, meanwhile, only proximity design features are subjected to processing different from conventional cases and this problem does not arise.

According to the manufacturing method of a semiconductor device of the invention, the following can be implemented when hole features, line features, and the like are formed in resist by applying the above-mentioned photomask: a desired resist pattern can be obtained and a depth of focus can be ensured and thus the process margin in photoengraving can be increased.

DETAILED DESCRIPTION

First Embodiment

Figure 1:
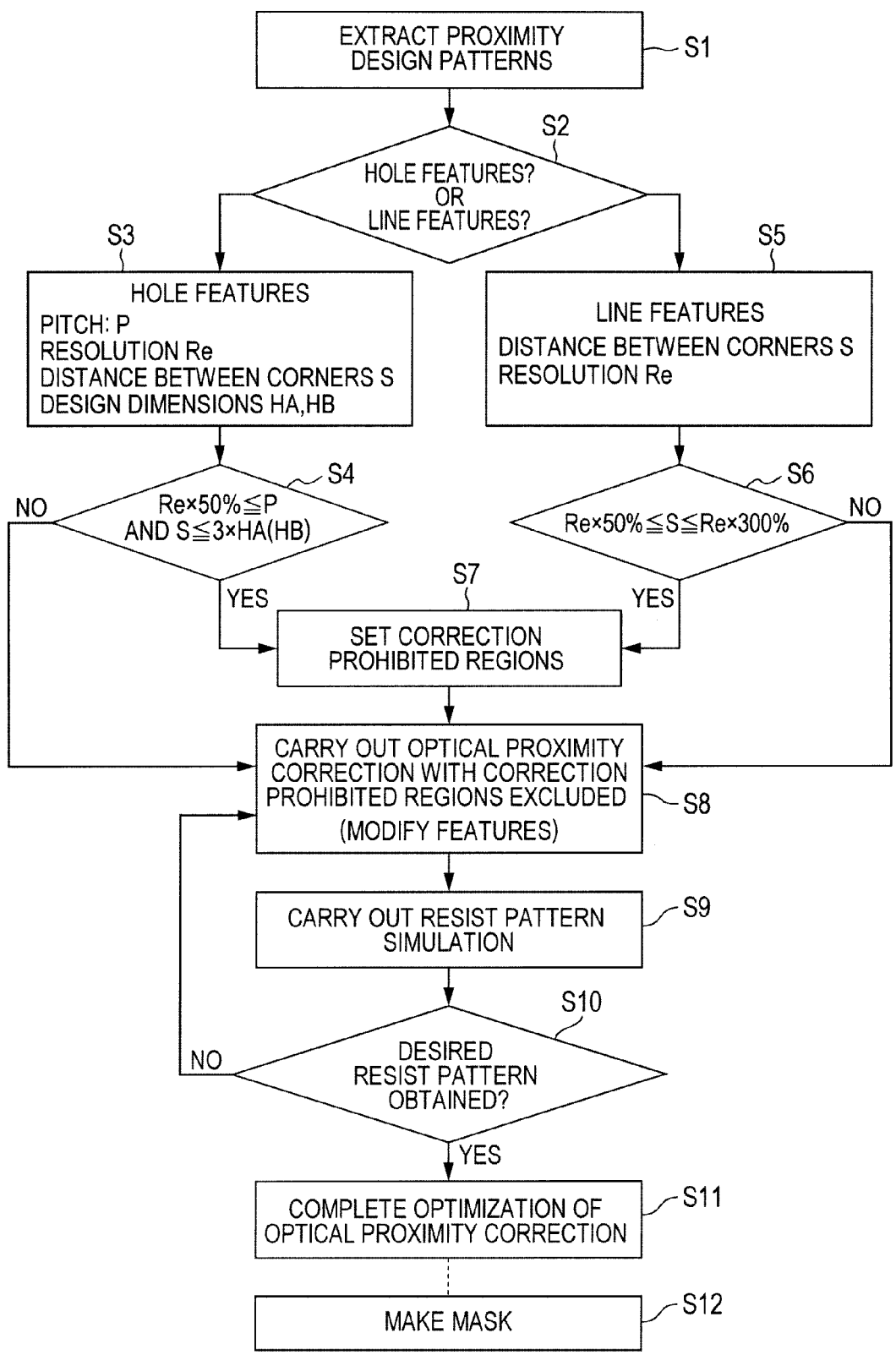
FIG. 1 is a flowchart illustrating a method for optical proximity correction in a first embodiment of the invention.

Description will be given to the overview of a method for optical proximity correction carried out on a pattern (data) with designed values used to manufacture a photomask and a manufacturing method of the photomask using this method with model-based OPC taken as an example. FIG. 1 is a flowchart of the method for optical proximity correction. At Step S1, as illustrated in FIG. 1, proximity design features close to each other are extracted. The proximity design features will be further brought close to each other when optical proximity correction is carried out; and they cannot be stably resolved as a photomask pattern at the close portions and are estimated to violate a mask rule check. At Step S2, subsequently, it is determined whether the extracted proximity design features are hole features or line features.

Figure 2:
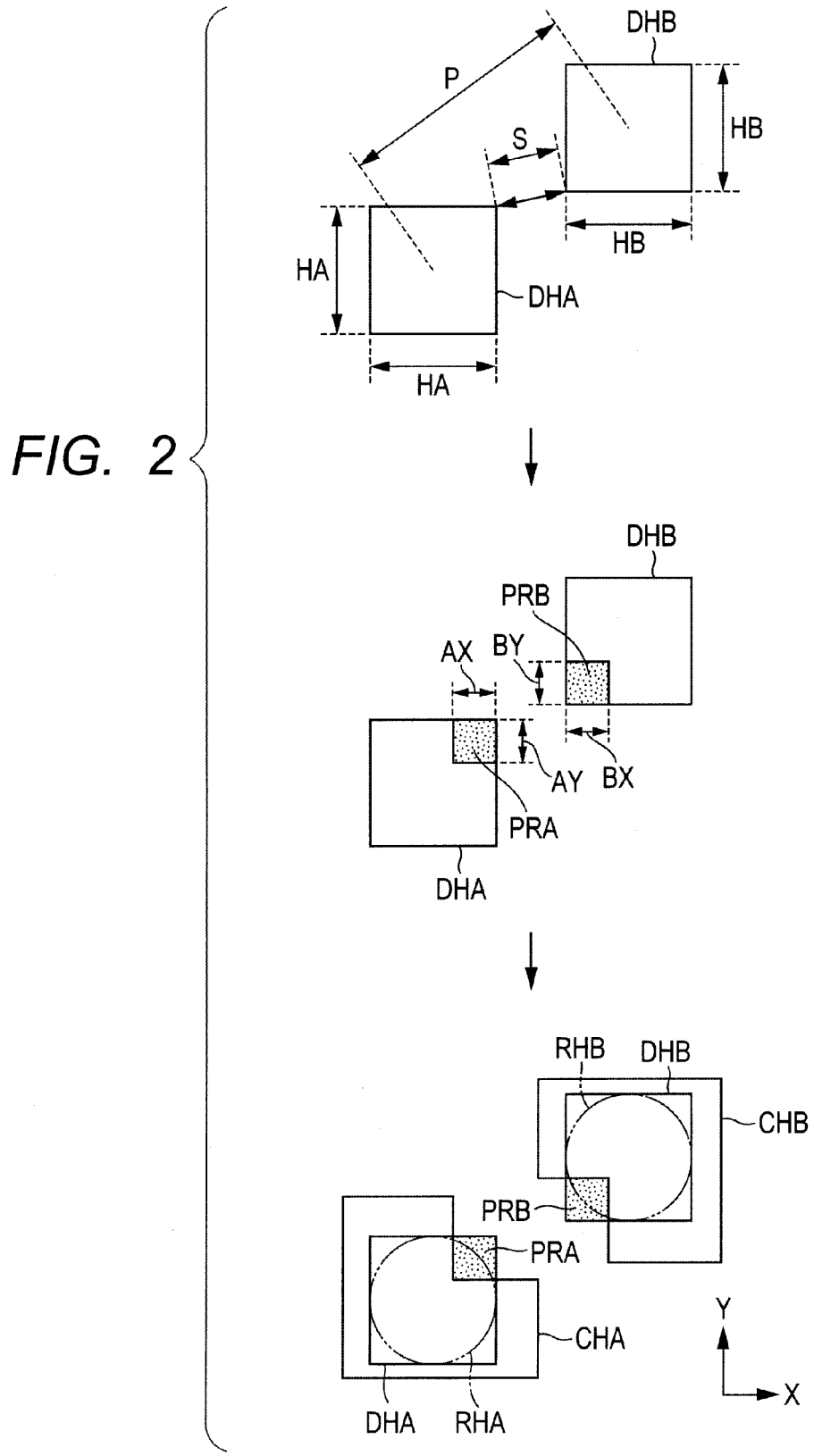
FIG. 2 is a drawing explaining a method for optical proximity correction in the case of hole features in the embodiment.

Subsequently, correction prohibited regions in which optical proximity correction is not carried out are set in the extracted proximity design features. This will be described first with respect to a case where the proximity design features are hole features. As illustrated in FIG. 2, it will be assumed that the extracted proximity design features are a hole feature DHA, HA in the length of each side and a hole feature DHB, HB in the length of each side. This length HA (HB) of each side is equivalent to the opening diameter of a target hole with designed values.

At Step S3, subsequently, the distance S between the corners closest to each other in the hole feature DHA and the hole feature DHB is calculated as shown at the upper tier of FIG. 2. In addition, the distance (pitch P) between the center of the hole feature DHA and the center of the hole feature DHB is calculated. Further, a resolution Re ($k1 \times \lambda / NA$) is calculated based on the wavelength $\lambda$ of the exposure light and the numerical aperture NA of an exposure device and a process-dependent parameter $k1$.

At Step S4, subsequently, it is determined, for example, whether or not the pitch P is equal to or larger than 50% of the resolution Re and the distance S is equal to or smaller than three times the length HA (HB) of each side of the hole feature. When these conditions are met, the following processing is carried out at Step S7 as shown at the middle tier of FIG. 2: a correction prohibited region PRA is set in the hole feature DHA and a correction prohibited region PRB is set in the hole feature DHB.

The length in the X-axis direction and the length in the Y-axis direction of each of the correction prohibited regions PRA, PRB are determined based on the arrangement relation between the hole feature DHA and the hole pattern DHB in the XY plane. Specifically, there are the following cases: cases where the length AX in the X-axis direction of the correction prohibited region PRA and the length AY in the Y-axis direction thereof are set to an identical value; and cases where the length AX in the X-axis direction and the length AY in the Y-axis direction are set to different values. For example, a value of 2 nm to ($2/3$)×HA nm or so is set for these lengths. In addition, there are the following cases: cases where the length BX in the X-axis direction of the correction prohibited region PRB and the length BY in the Y-axis direction thereof are set to an identical value; and cases where the length BX in the X-axis direction and the length BY in the Y-axis direction are set to different values. For example, a value of 2 nm to ($2/3$)×HB nm or so is set for these lengths.

At Step S8, subsequently, optical proximity correction is carried out on the hole feature DHA and the hole feature DHB with the correction prohibited regions PRA, PRB excluded. At Step S9, subsequently, shape simulation for a resist pattern is carried out based on the hole features that underwent optical proximity correction. At Step S10, subsequently, it is determined whether or not the resist pattern obtained by the shape simulation is sufficiently equivalent to a desired resist pattern based on designed values. When the desired resist pattern has not been obtained, the processing of Step S8 and Step S9 is repeated until the desired resist pattern is obtained.

Thus the following is implemented as shown at the lower tier of FIG. 2: with respect to the hole feature DHA, a corrected hole feature CHA is obtained with the correction prohibited region PRA excluded; and with respect to the hole feature DHB, a corrected hole feature CHB is obtained with the correction prohibited region PRB excluded. The shape of a resist pattern RHA obtained based on the corrected hole feature CHA substantially agrees with the following shape: the shape of a resist pattern inscribed to the four sides of the hole feature DHA, obtained based on the hole feature DHA before the correction prohibited region PRA is set.

The shape of a resist pattern RHB obtained based on the corrected hole feature CHB substantially agrees with the following shape: the shape of a resist pattern inscribed to the four sides of the hole feature DHB, obtained based on the hole feature DHB before the correction prohibited region PRB is set. The optimization of optical proximity correction on hole features close to each other is completed as mentioned above (Step S11).

Figure 3:
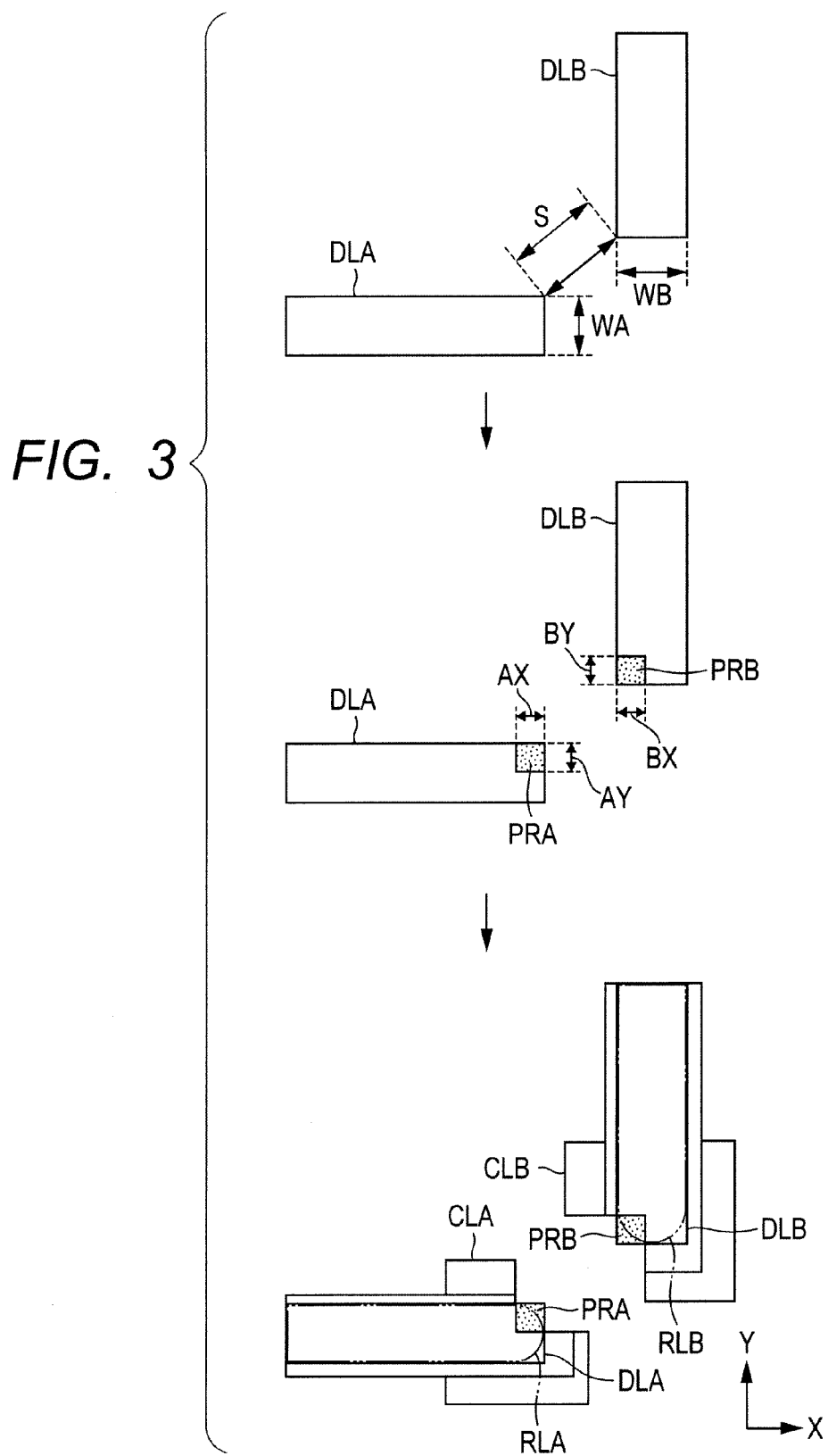
FIG. 3 is a drawing explaining a method for optical proximity correction in the case of line features in the embodiment.

Description will be give to a case where the features close to each other are line features. As illustrated in FIG. 3, it will be assumed that the extracted proximity design features are a line feature DLA, WA in width and a line feature DLB, WB in width. This width WA (WB) is equivalent to the width of a target line with designed values.

At Step S5, subsequently, the distance S between the corners closest to each other in the line feature DLA and the line feature DLB is calculated as shown at the upper tier of FIG. 3. In addition, a resolution Re ($k1 \times \lambda/NA$) is calculated based on the wavelength $\lambda$ of the exposure light and the numerical aperture NA of an exposure device and a process-dependent parameter $k1$.

At Step S6, subsequently, it is determined, for example, whether or not the distance S is not less than 50% of the resolution Re and not more than 300% thereof. When this condition is met, the following processing is carried out at Step S7 as shown at the middle tier of FIG. 3: a correction prohibited region PRA is set in the line feature DLA and a correction prohibited region PRB is set in the line feature DLB.

The length in the X-axis direction and the length in the Y-axis direction of each of the correction prohibited regions PRA, PRB are determined based on the arrangement relation between the line feature DLA and the line feature DLB in the XY plane. Specifically, there are the following cases: cases where the length AX in the X-axis direction of the correction prohibited region PRA and the length AY in the Y-axis direction thereof are set to an identical value; and cases where the length AX in the X-axis direction and the length AY in the Y-axis direction are set to different values. For example, a value of 2 nm to (⅔)×WA nm or so is set for these lengths. In addition, there are the following cases: cases where the length BX in the X-axis direction of the correction prohibited region PRB and the length BY in the Y-axis direction thereof are set to an identical value; and cases where the length BX in the X-axis direction and the length BY in the Y-axis direction are set to different values. For example, a value of 2 nm to (⅔)×WB nm or so is set for these lengths.

At Step S8, subsequently, optical proximity correction is carried out on the line feature DLA and the line feature DLB with the correction prohibited regions PRA, PRB excluded. At Step S9, subsequently, shape simulation for a resist pattern is carried out based on the line features that underwent optical proximity correction. At Step S10, subsequently, it is determined whether or not the resist pattern obtained by the shape simulation is sufficiently equivalent to a desired resist pattern based on designed values. When the desired resist pattern has not been obtained, the processing of Step S8 and Step S9 is repeated until the desired resist pattern is obtained.

Thus the following is implemented as shown at the lower tier of FIG. 3: with respect to the line feature DLA, a corrected line feature CLA is obtained with the correction prohibited region PRA excluded; and with respect to the line feature DLB, a corrected line feature CLB is obtained with the correction prohibited region PRB excluded. The shape of a resist pattern RLA obtained based on the corrected line feature CLA substantially agrees with the following shape: the shape of a resist pattern in contact with the sides of the line feature DLA in the direction of length and a side of an end portion thereof, obtained based on the line feature DLA before the correction prohibited region PRA is set.

The shape of a resist pattern RLB obtained based on the corrected line feature CLB substantially agrees with the following shape: the shape of a resist pattern in contact with the sides of the line feature DLB in the direction of length and a side of an end portion, obtained based on the line feature DLB before the correction prohibited region PRB is set. The optimization of optical proximity correction on line features close to each other is completed as mentioned above (Step S11).

A photomask is formed by taking the following procedure (Step S12): a resist film for electron beam exposure over a light shield film is scanned with an electron beam based on the data of a desired pattern containing the hole features or the line features for which the optimization of optical proximity correction has been completed; the pattern is thereby drawn and is subjected to predetermined development; and the light shield film (mask material) is subjected to etching processing.

The photomask manufactured by applying the above-mentioned method for optical proximity correction brings about the following advantage: a desired resist pattern (the patterning shape of a film to be processed over a semiconductor substrate) can be obtained from target designed values without violating a mask rule check.

This will be described based on the relation with a manufacturing method of a photomask in a comparative example. First, description will be given to a case of hole features. As illustrated at the upper tier of FIG. 4, optical proximity correction is carried out on a design hole feature DHA and a design hole feature DHB close to each other and a corrected hole feature CCHA and a corrected hole feature CCHB are thereby obtained. If it is impossible to stably resolve the corrected hole feature CCHA and the corrected hole feature CCHB as a photomask at this time and a mask rule check is violated (in the broken line frame), the following measure is taken: the patterns are corrected so that the mask rule check is not violated.

Figure 4:
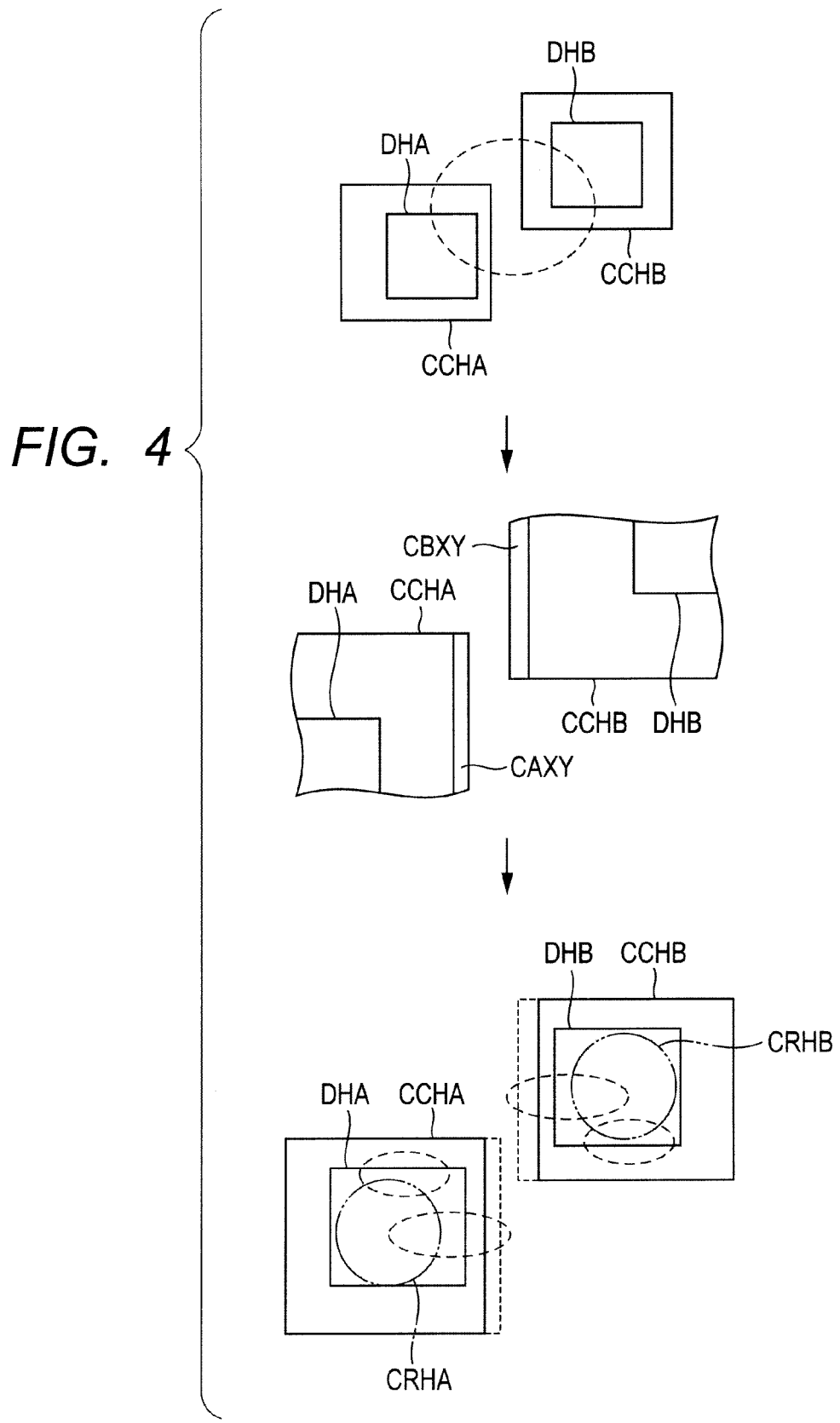
FIG. 4 is a drawing explaining optical proximity correction in the case of hole features in a comparative example.

That is, the means illustrated at the middle tier of FIG. 4 is taken. Specifically, in the corrected hole feature CCHA, the area CAXY on the side where it is opposed to the corrected hole feature CCHB is retreated and brought away from the corrected hole feature CCHB. In the corrected hole feature CCHB, meanwhile, the area CBXY on the side where it is opposed to the corrected hole feature CCHA is retreated and brought away from the corrected hole feature CCHA.

For this reason, the following takes place even though the corrected hole feature CCHA (CCHB) is initially set so that a resist pattern inscribed to the four sides of the design hole feature DHA (DHB) can be obtained: as illustrated at the lower tier of FIG. 4, a resist pattern CRHA (CRHB) that is not inscribed to, for example, at least two sides of the hole feature DHA (DHB) (in the broken line frames) is formed and a desired resist pattern cannot be obtained.

Description will be given to a case of line features. As illustrated at the upper tier of FIG. 5, optical proximity correction is carried out on a design line feature DLA and a design line feature DLB close to each other and a corrected line feature CCLA and a corrected line feature CCLB are thereby obtained. If it is impossible to stably resolve the corrected line feature CCLA and the corrected line feature CCLB as a photomask and a mask rule check is violated (in the broken line frame), the following measure is taken: the patterns are corrected by the techniques disclosed in Patent Documents 1 and 2 so that the mask rule check is not violated.

Figure 5:
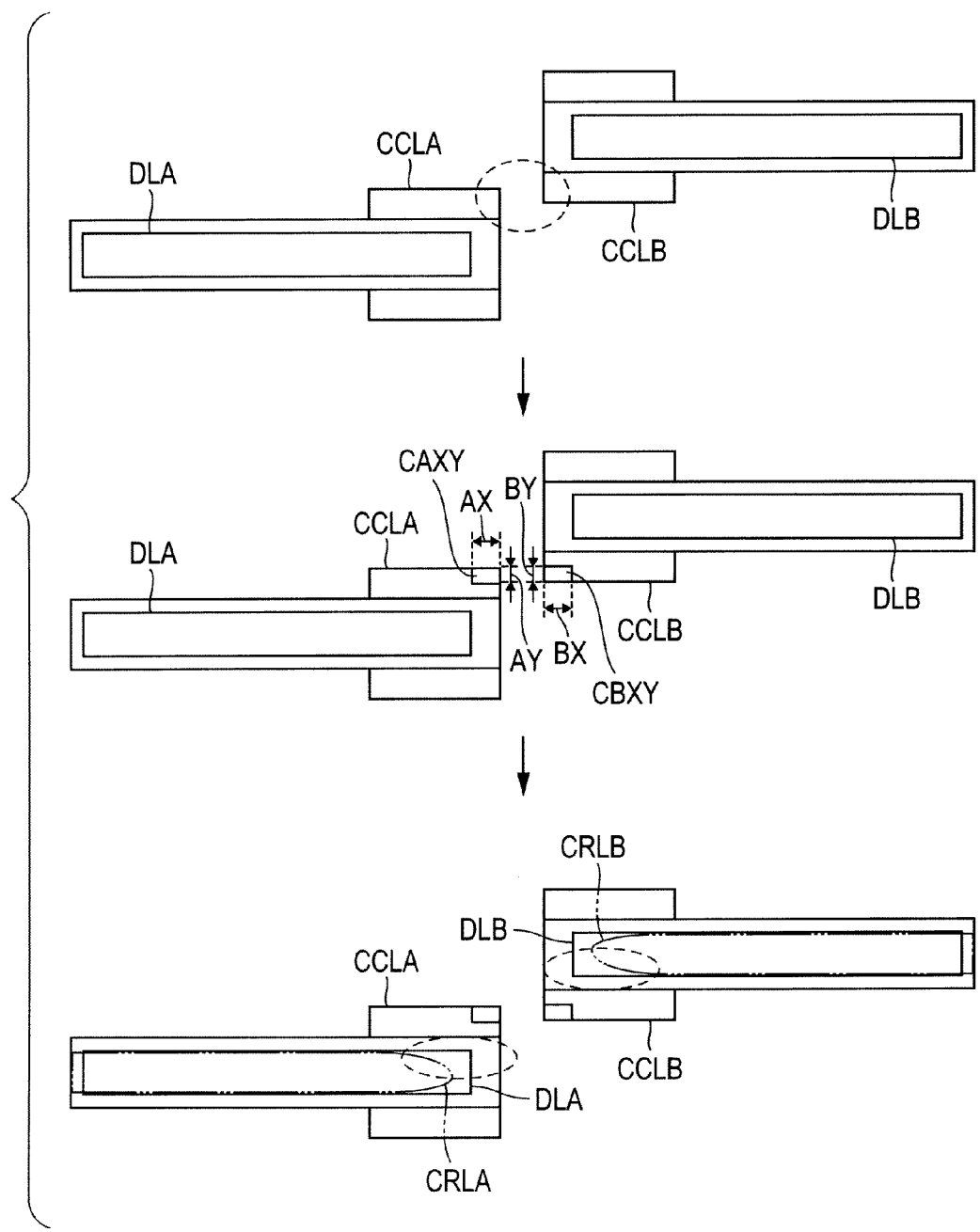
FIG. 5 is a drawing explaining optical proximity correction in the case of line features in a comparative example.

That is, the means illustrated at the middle tier of FIG. 5 is taken. Specifically, in the corrected line feature CCLA, the area CAXY on the side where it is opposed to the corrected line feature CCLB is retreated and brought away from the corrected line feature CCLB. In the corrected line feature CCLB, meanwhile, the area CBXY on the side where it is opposed to the corrected line feature CCLA is retreated and brought away from the corrected line feature CCLA.

For this reason, a problem arises even though the corrected line feature CCLA (CCLB) is initially set so that the following can be implemented: a resist pattern in contact with the two side of the design line feature DLA (DLB) in the direction of length and a side of an end portion can be obtained. As illustrated at the lower tier of FIG. 5, the following resist pattern is formed: a resist pattern CRLA (CRLB) that is in contact with, for example, only two sides of the design line feature DLA (DLB) in the direction of length but not in contact with a side of an end portion (in the broken line frames). Thus a desired resist pattern cannot be obtained.

As mentioned above, the following measure is taken in hole features or line features close to each other in the manufacturing method of a photomask in the comparative example: part of the patterns of the photomask is corrected so that a mask rule check is not violated. For this reason, a desired resist pattern (the patterning shape of a film to be processed over a semiconductor substrate) with target designed values cannot be obtained.

In the above-mentioned manufacturing method of a photomask, meanwhile, the following measure is taken in features that are close to each other and estimated to violate a mask rule check after optical proximity correction is carried out: before the optical proximity correction is carried out, correction prohibited regions in which optical proximity correction is not carried out are set and then optical proximity correction is carried out. This makes it possible to obtain a resist pattern (the patterning shape of a film to be processed over a semiconductor substrate) with target designed values without violating a mask rule check.

Second Embodiment

Figure 6:
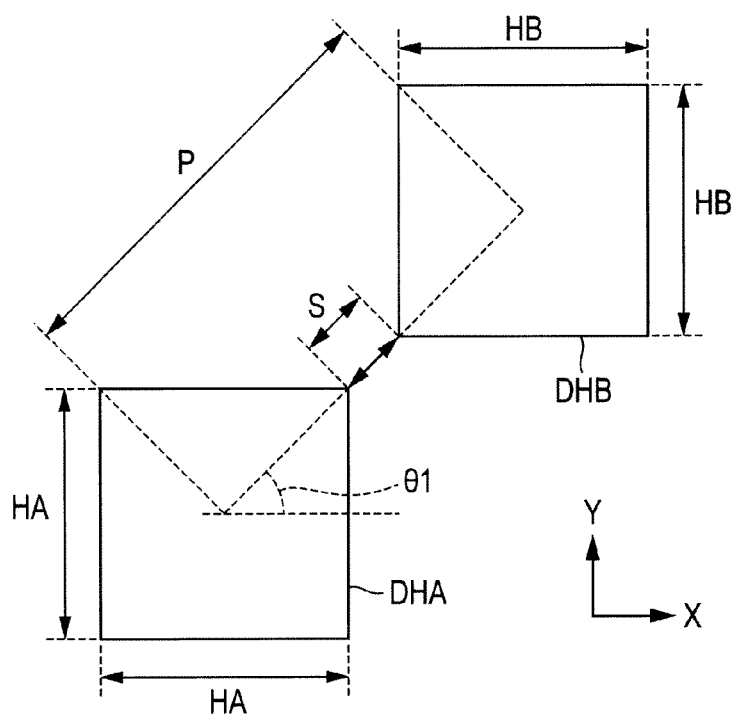
FIG. 6 is a plan view illustrating a step in a manufacturing method of a photomask to which a method for optical proximity correction in a second embodiment of the invention is applied.

Description will be given to a more concrete first example of the manufacturing method of a photomask. As illustrated in FIG. 6, first, it will be assumed that the following hole features are hole features that are close to each other and estimated to violate a mask rule check when optical proximity correction is carried out: a hole feature DHA, HA (=75 nm) in the length of each side and a hole feature DHB, HB (=75 nm) in the length of each side. In addition, it will be assumed that the angle θ1 formed by a line segment connecting the center of the hole feature DHA and the center of the hole feature DHB and the X-axis is 45°.

Subsequently, the distance S (=21 nm) between the corners closest to each other in the hole feature DHA and the hole feature DHB is calculated. In addition, the distance (pitch P) between the center of the hole feature DHA and the center of the hole feature DHB is calculated. Further, a resolution Re (k1×λ/NA) is calculated based on the wavelength λ of the exposure light and the numerical aperture NA of an exposure device and a process-dependent parameter k1.

Figure 7:
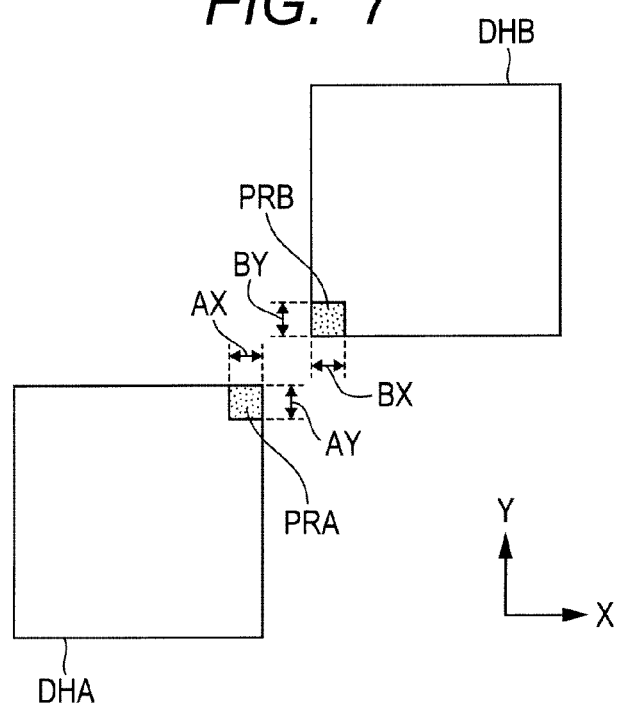
FIG. 7 is a plan view illustrating a step carried out after the step illustrated in FIG. 6 in the embodiment.

Subsequently, for example, it is determined whether or not the pitch P is equal to or larger than 50% of the resolution Re and the distance S is equal to or smaller than three times the length HA (HB) of each side of each hole feature. When these conditions are met, the following measure is taken as illustrated in FIG. 7: a correction prohibited region PRA is set in the hole feature DHA and a correction prohibited region PRB is set in the hole feature DHB.

The length in the X-axis direction and the length in the Y-axis direction of each of the correction prohibited regions PRA, PRB are determined based on the arrangement relation between the hole feature DHA and the hole feature DHB in the XY plane. Since the angle θ1 is 45°, in this case, the following measure is taken: the length AX in the X-axis direction of the correction prohibited region PRA and the length AY in the Y-axis direction thereof are set to an identical value (10 nm); and the length BX in the X-axis direction of the correction prohibited region PRB and the length BY in the Y-axis direction thereof are also set to an identical value (10 nm).

Figure 8:
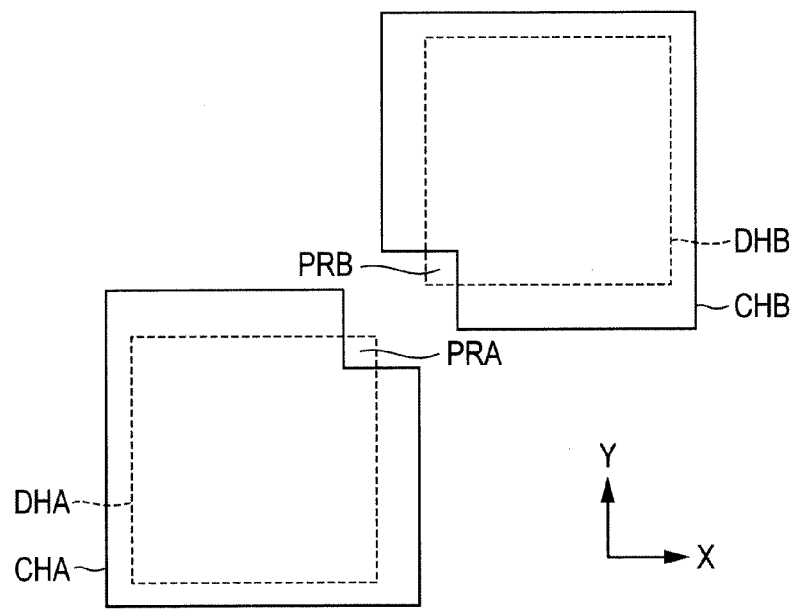
FIG. 8 is a plan view illustrating a step carried out after the step illustrated in FIG. 7 in the embodiment.

Subsequently, optical proximity correction is carried out on the hole feature DHA and the hole feature DHB with the correction prohibited regions PRA, PRB excluded. Then shape simulation for a resist pattern is carried out based on the hole features that underwent the optical proximity correction. In model-based OPC, as mentioned above, the pattern deformation and the shape simulation for a resist pattern are repeated until a resist pattern with target designed values is obtained. Thus the following processing is carried out as illustrated in FIG. 8: with respect to the hole feature DHA, a corrected hole feature CHA is obtained with the correction prohibited region PRA excluded; and with respect to the hole feature DHB, a corrected hole feature CHB is obtained with the correction prohibited region PRB excluded.

Subsequently, a photomask is manufactured by carrying out electron beam lithography based on the data of the obtained corrected hole feature CHA and the data of the obtained corrected hole feature CHB. First, a resist film for electron beam exposure over a light shield film formed over the surface of a glass plate is scanned with an electron beam based on the data. A predetermined pattern containing the corrected hole feature CHA and the corrected hole feature CHB is thereby drawn. Subsequently, the resist film for electron beam exposure is subjected to predetermined development and a resist pattern corresponding to the corrected hole feature CHA and the corrected hole feature CHB is thereby formed.

Figure 9:
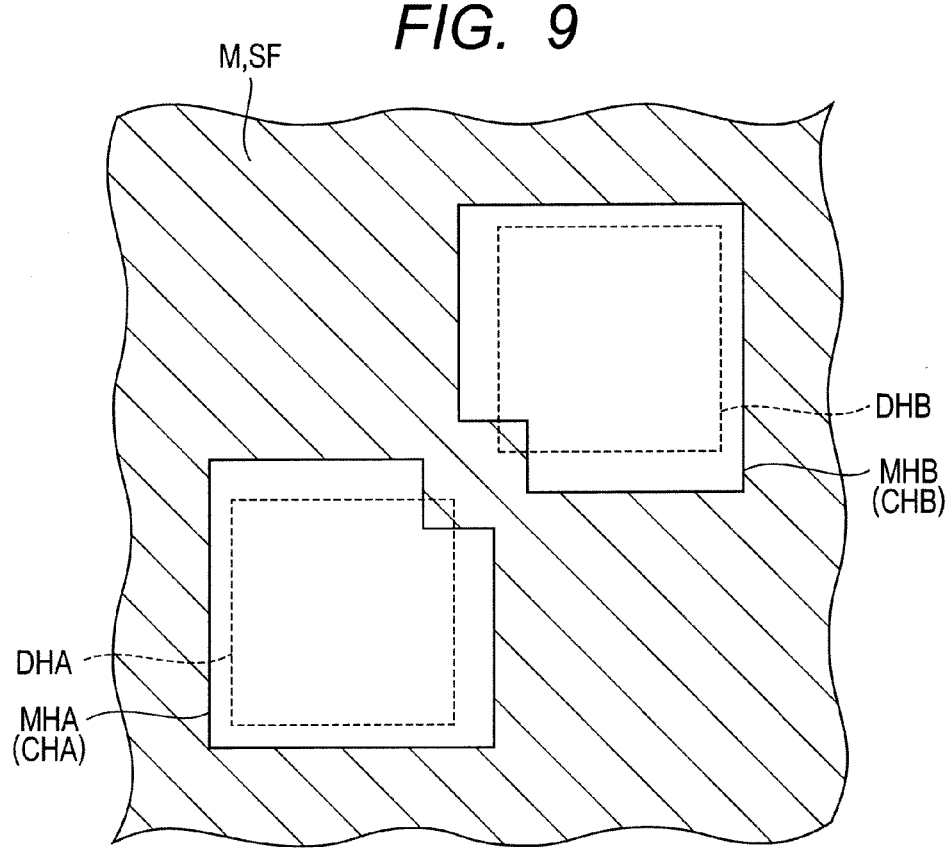
FIG. 9 is a plan view illustrating a photomask made based on data obtained from the step illustrated in FIG. 8 in the embodiment.
Figure 10:
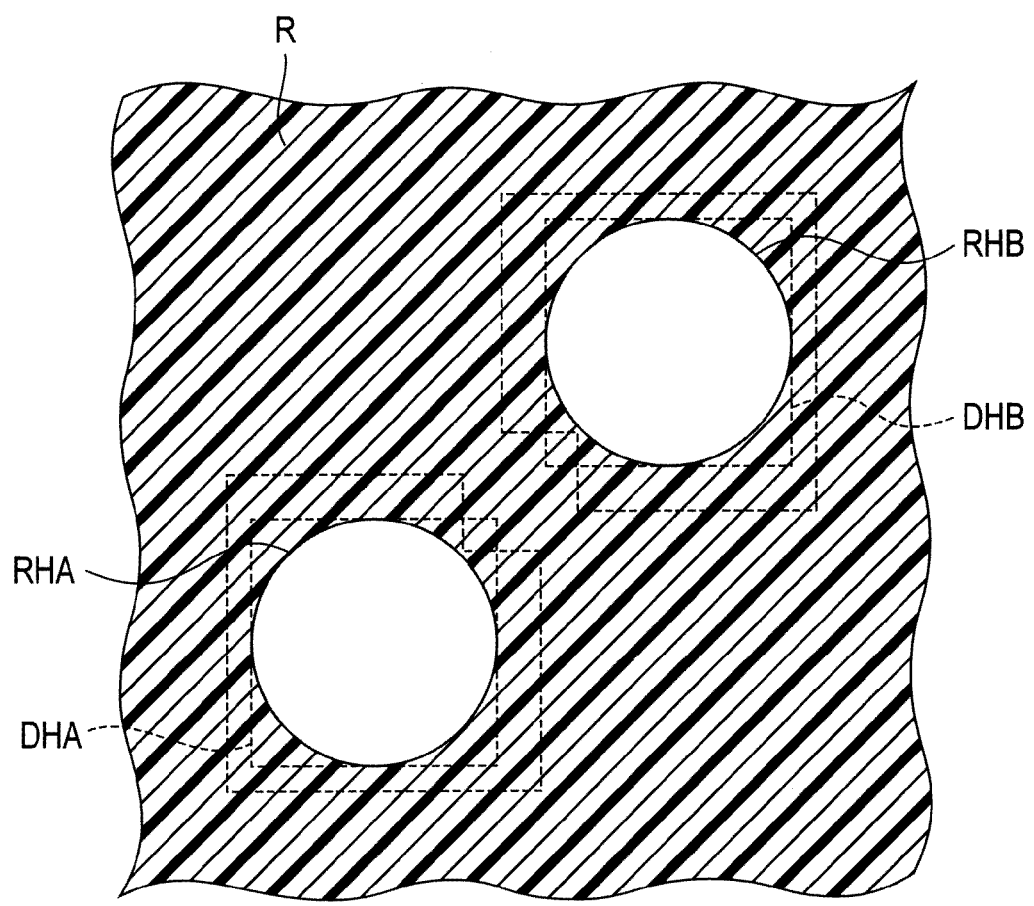
FIG. 10 is a plan view illustrating a resist pattern subjected to photoengraving and development using the photomask illustrated in FIG. 9 in the embodiment.

Subsequently, the light shield film is etched using the resist pattern as a mask. As a result, as illustrated in FIG. 9, a photomask M is manufactured. The photomask is obtained by forming a photomask hole feature MHA corresponding to the corrected hole feature CHA and a photomask hole feature MHB corresponding to the corrected hole feature CHB in the light shield film SF. Using the thus manufactured photomask M, resist applied to a semiconductor substrate is subjected to photoengraving and development. As illustrated in FIG. 10, consequently, a resist pattern RHA and a resist pattern RHB are formed in the resist (positive resist) R.

In the above-mentioned manufacturing method of a photomask, the following procedure is taken. Features that are close to each other and are estimated to violate a mask rule check after optical proximity correction is carried out are extracted. In these features, correction prohibited regions in which optical proximity correction is not carried out are set based on the arrangement relation between the features. Thereafter, optical proximity correction is carried out. Especially, in this case, the angle θ1 is 45° and thus the length in the X-axis direction and the length in the Y-axis direction of each of the correction prohibited regions PRA, PRB are set to an identical value. As a result, a photomask that makes it possible to obtain a target resist pattern (the patterning shape of a film to be processed over a semiconductor substrate) without violating a mask rule check can be obtained.

Figure 11:
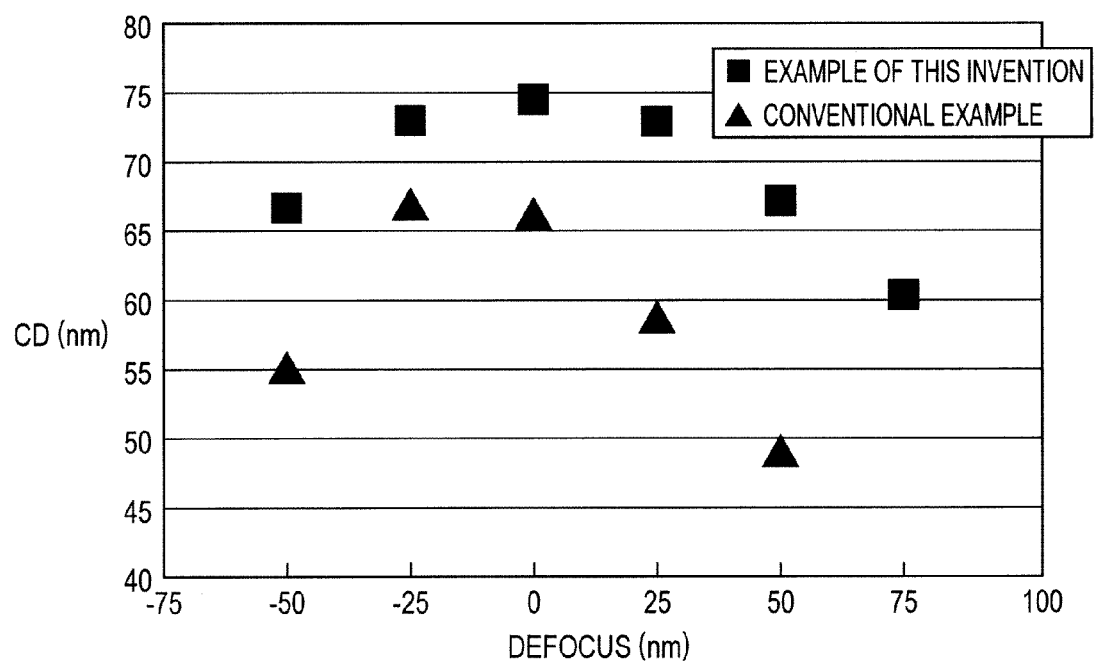
FIG. 11 is a graph indicating the relation between CD value and defocus amount in the embodiment.

With the above-mentioned photomask, a desired resist pattern based on designed values can be obtained and thus it is possible to ensure a depth of focus (DOF). This will be described using a conventional method as well. FIG. 11 is a graph indicating the relation between CD (Critical Dimension) value and defocus amount. The embodiment of this invention shows the result obtained in the above-mentioned case where a photomask in which the length in the X-axis direction and the length in the Y-axis direction of each of the correction prohibited regions PRA, PRB are set to 10 nm. The conventional method shows the result obtained when a photomask manufactured by the technique illustrated in FIG. 4 is used.

It will be assumed that the target CD value is, for example, 75 nm. In this case, it is seen from FIG. 11 that the target CD value is achieved in the example (square). It is also seen that in the embodiment of the invention, the descent of the CD value is gentle with just focus (0 nm) at the center and a sufficient depth of focus can be ensured.

Meanwhile, it is seen that the following takes place in the conventional method (triangle): the target CD value cannot be achieved; the descent of the CD value is steeper than in the embodiment of the invention with just focus (0 nm) at the center and a sufficient depth of focus cannot be ensured.

Third Embodiment

Figure 12:
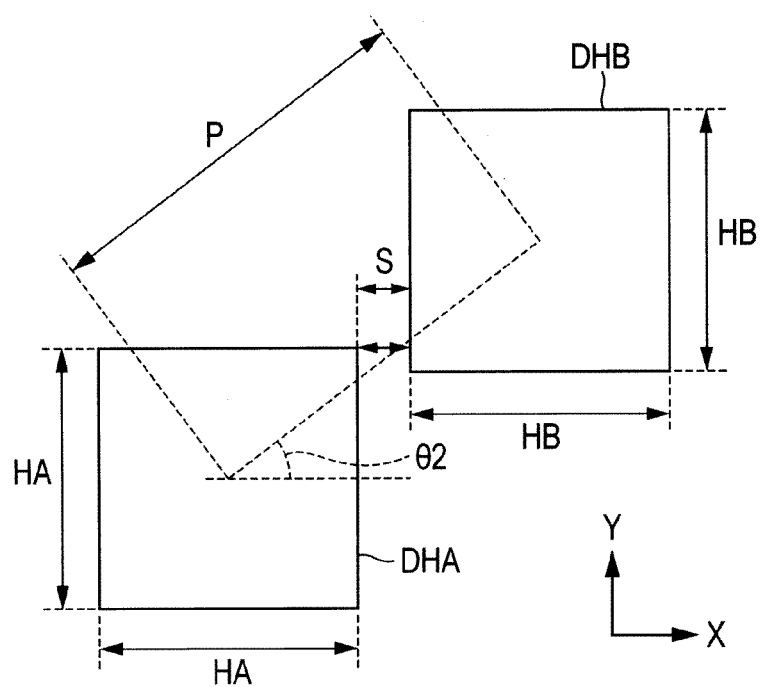
FIG. 12 is a plan view illustrating a step in a manufacturing method of a photomask to which a method for optical proximity correction in a third embodiment of the invention is applied.

Description will be given to a more concrete second example of the manufacturing method of a photomask. As illustrated in FIG. 12, first, it will be assumed that the following hole features are hole features that are close to each other and estimated to violate a mask rule check when optical proximity correction is carried out: a hole feature DHA, HA (=75 nm) in the length of each side and a hole feature DHB, HB (=75 nm) in the length of each side. In addition, it will be assumed that the angle $\theta 2$ formed by a line segment connecting the center of the hole feature DHA and the center of the hole feature DHB and the X-axis is 35°.

Subsequently, the distance S (=16 nm) between the corners closest to each other in the hole feature DHA and the hole feature DHB is calculated. In addition, the distance (pitch P) between the center of the hole feature DHA and the center of the hole feature DHB is calculated. Further, a resolution Re (k1×λ/NA) is calculated based on the wavelength λ of the exposure light and the numerical aperture NA of an exposure device and a process-dependent parameter k1.

Figure 13:
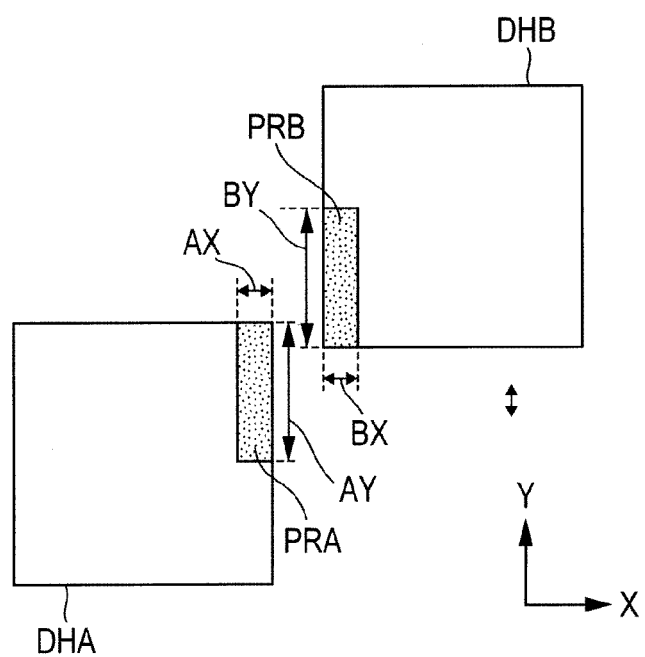
FIG. 13 is a plan view illustrating a step carried out after the step illustrated in FIG. 12 in the embodiment.

Subsequently, for example, it is determined whether or not the pitch P is equal to or larger than 50% of the resolution Re and the distance S is equal to or smaller than three times the length HA (HB) of each side of each hole feature. When these conditions are met, the following measure is taken as illustrated in FIG. 13: a correction prohibited region PRA is set in the hole feature DHA and a correction prohibited region PRB is set in the hole feature DHB.

The length in the X-axis direction and the length in the Y-axis direction of each of the correction prohibited regions PRA, PRB are determined based on the arrangement relation between the hole feature DHA and the hole feature DHB in the XY plane. Since the angle $\theta 2$ is 35°, in this case, the following measure is taken: the length AY (40 nm) in the Y-axis direction of the correction prohibited region PRA is set to a value larger than the length AX (10 nm) in the X-axis direction thereof; and the length BY (40 nm) in the Y-axis direction of the correction prohibited region PRB is set to a value larger than the length BX (10 nm) in the X-axis direction thereof.

Figure 14:
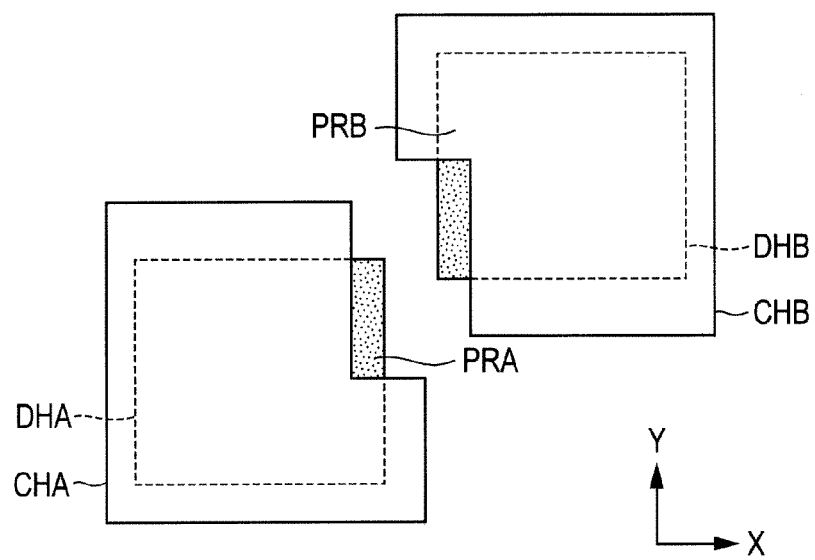
FIG. 14 is a plan view illustrating a step carried out after the step illustrated in FIG. 13 in the embodiment.

Subsequently, optical proximity correction is carried out on the hole feature DHA and the hole feature DHB with the correction prohibited regions PRA, PRB excluded. Then shape simulation for a resist pattern is carried out based on the hole features that underwent the optical proximity correction. In model-based OPC, as mentioned above, the pattern deformation and the shape simulation for a resist pattern are repeated until a target resist pattern is obtained. Thus the following processing is carried out as illustrated in FIG. 14: with respect to the hole feature DHA, a corrected hole feature CHA is obtained with the correction prohibited region PRA excluded; and with respect to the hole feature DHB, a corrected hole feature CHB is obtained with the correction prohibited region PRB excluded.

Subsequently, a predetermined pattern containing the corrected hole feature CHA and the corrected hole feature CHB is drawn by scanning a resist film for electron beam exposure over a light shield film formed over the surface of a glass plate with an electron beam. This scanning is carried out based on the data of the obtained corrected hole feature CHA and the data of the obtained corrected hole feature CHB. Subsequently, a resist pattern corresponding to the corrected hole feature CHA and the corrected hole feature CHB is formed by subjecting the resist film for electron beam exposure to predetermined development.

Figure 15:
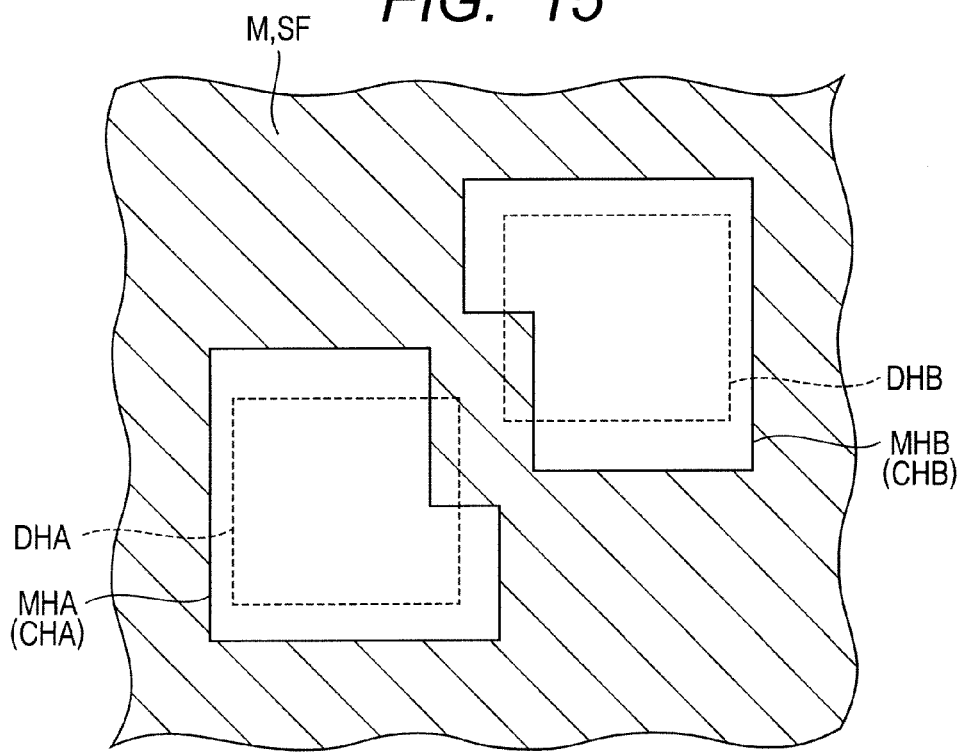
FIG. 15 is a plan view illustrating a photomask made based on data obtained from the step illustrated in FIG. 14 in the embodiment.
Figure 16:
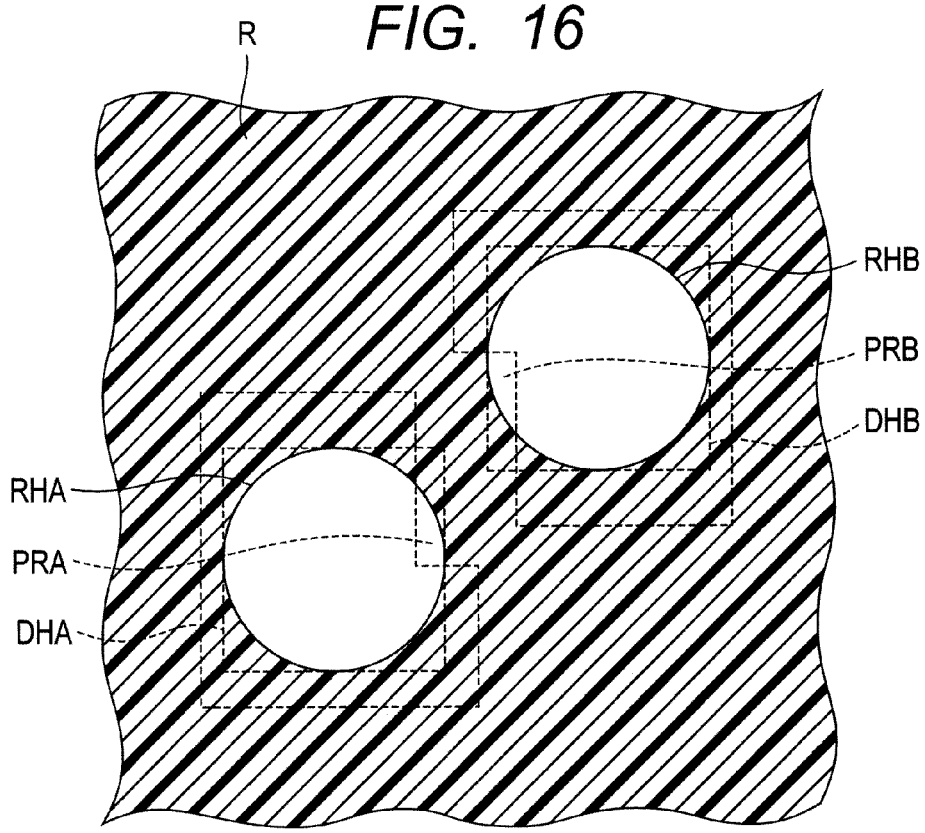
FIG. 16 is a plan view illustrating a resist pattern subjected to photoengraving and development using the photomask illustrated in FIG. 15 in the embodiment.

Subsequently, the following photomask is manufactured by etching the light shield film using this resist pattern as a mask as illustrated in FIG. 15: a photomask M in which a photomask hole feature MHA corresponding to the corrected hole feature CHA and a photomask hole feature MHB corresponding to the corrected hole feature CHB are formed in the light shield film SF. Using the thus manufactured photomask M, resist applied to a semiconductor substrate is subjected to photoengraving and development. As illustrated in FIG. 16, consequently, a resist pattern RHA and a resist pattern RHB are formed in the resist (positive resist) R.

In the above-mentioned manufacturing method of a photomask, the following procedure is taken. Features that are close to each other and are estimated to violate a mask rule check after optical proximity correction is carried out are extracted. In these features, correction prohibited regions in which optical proximity correction is not carried out are set based on the arrangement relation between the features. Thereafter, optical proximity correction is carried out. Especially, in this case, the angle $\theta 2$ is 35° and thus the length in the X-axis direction and the length in the Y-axis direction of each of the correction prohibited regions PRA, PRB are set to different values. As a result, a photomask that makes it possible to obtain a target resist pattern (the patterning shape of a film to be processed over a semiconductor substrate) without violating a mask rule check can be obtained. In addition, since a desired resist pattern based on designed values is obtained, it is possible to ensure a sufficient depth of focus.

Fourth Embodiment

Figure 17:
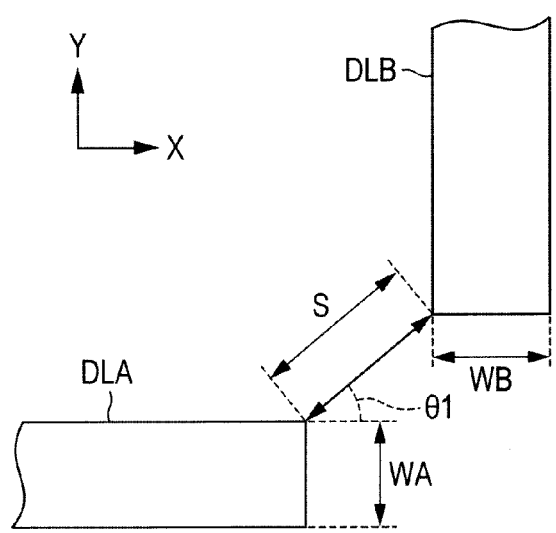
FIG. 17 is a plan view illustrating a step in a manufacturing method of a photomask to which a method for optical proximity correction in a fourth embodiment of the invention is applied.

Description will be given to a more concrete third example of the manufacturing method of a photomask. As illustrated in FIG. 17, it will be assumed that the followings are line features that are close to each other and estimated to violate a mask rule check when optical proximity correction is carried out: a line feature DLA, WA in width and a line feature DLB, WB in width. In addition, it will be assumed that the angle $\theta 1$ formed by a line segment connecting the corners closest to each other in the line feature DLA and the line feature DLB and the X-axis is 45°.

Figure 18:
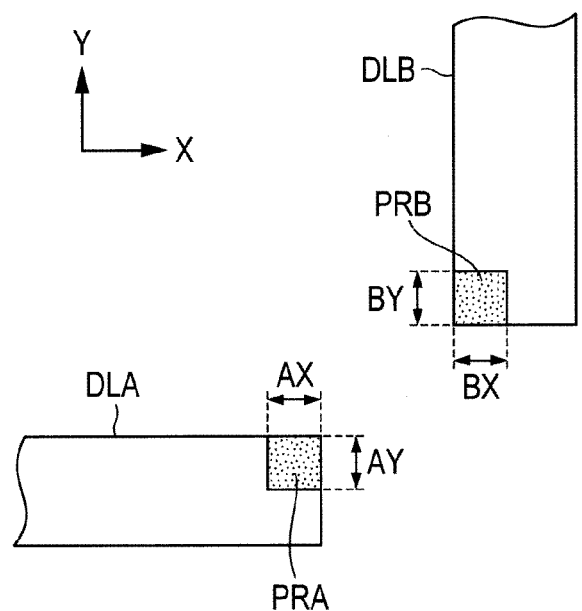
FIG. 18 is a plan view illustrating a step carried out after the step illustrated in FIG. 17 in the embodiment.

Subsequently, the distance S between the corners closest to each other in the line feature DLA and the line feature DLB is calculated. Further, a resolution Re (k1×λ/NA) is calculated based on the wavelength λ of the exposure light and the numerical aperture NA of an exposure device and a process-dependent parameter k1. Subsequently, for example, it is determined whether or not the distance S is not less than 50% of the resolution Re and not more than 300% thereof. When this condition is met, the following measure is taken as illustrated in FIG. 18: a correction prohibited region PRA is set in the line feature DLA and a correction prohibited region PRB is set in the line feature DLB.

The length in the X-axis direction and the length in the Y-axis direction of each of the correction prohibited regions PRA, PRB are determined based on the arrangement relation between the line feature DLA and the line feature DLB in the XY plane. Since the angle θ1 is 45°, in this case, the following measure is taken: the length AX in the X-axis direction of the correction prohibited region PRA and the length AY in the Y-axis direction thereof are set to an identical value; and the length BX in the X-axis direction of the correction prohibited region PRB and the length BY in the Y-axis direction thereof are also set to an identical value.

Figure 19:
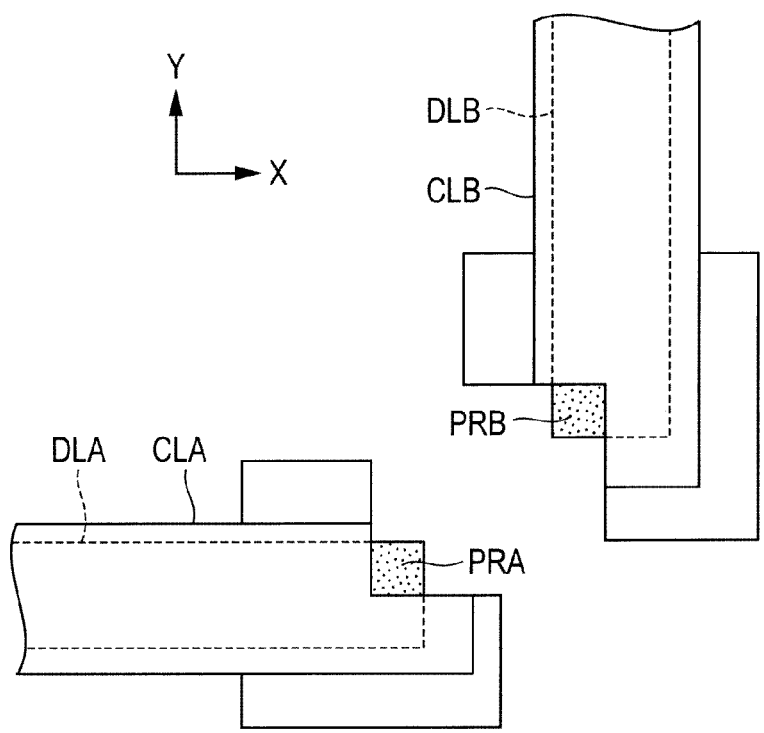
FIG. 19 is a plan view illustrating a step carried out after the step illustrated in FIG. 18 in the embodiment.

Subsequently, optical proximity correction is carried out on the line feature DLA and the line feature DLB with the correction prohibited regions PRA, PRB excluded. Then shape simulation for a resist pattern is carried out based on the line features that underwent the optical proximity correction. In model-based OPC, as mentioned above, the pattern deformation and the shape simulation for a resist pattern are repeated until a target resist pattern is obtained. Thus the following processing is carried out as illustrated in FIG. 19: with respect to the line feature DLA, a corrected line feature CLA is obtained with the correction prohibited region PRA excluded; and with respect to the line feature DLB, a corrected line feature CLB is obtained with the correction prohibited region PRB excluded.

Subsequently, a photomask is manufactured by carrying out electron beam lithography based on the data of the obtained corrected line feature CLA and the data of the obtained corrected line feature CLB. First, a resist film for electron beam exposure over a light shield film formed over the surface of a glass plate is scanned with an electron beam based on the data. A predetermined pattern containing the corrected line feature CLA and the corrected line feature CLB is thereby drawn. Subsequently, the resist film for electron beam exposure is subjected to predetermined development and a resist pattern corresponding to the corrected line feature CLA and the corrected line feature CLB is thereby formed.

Figure 20:
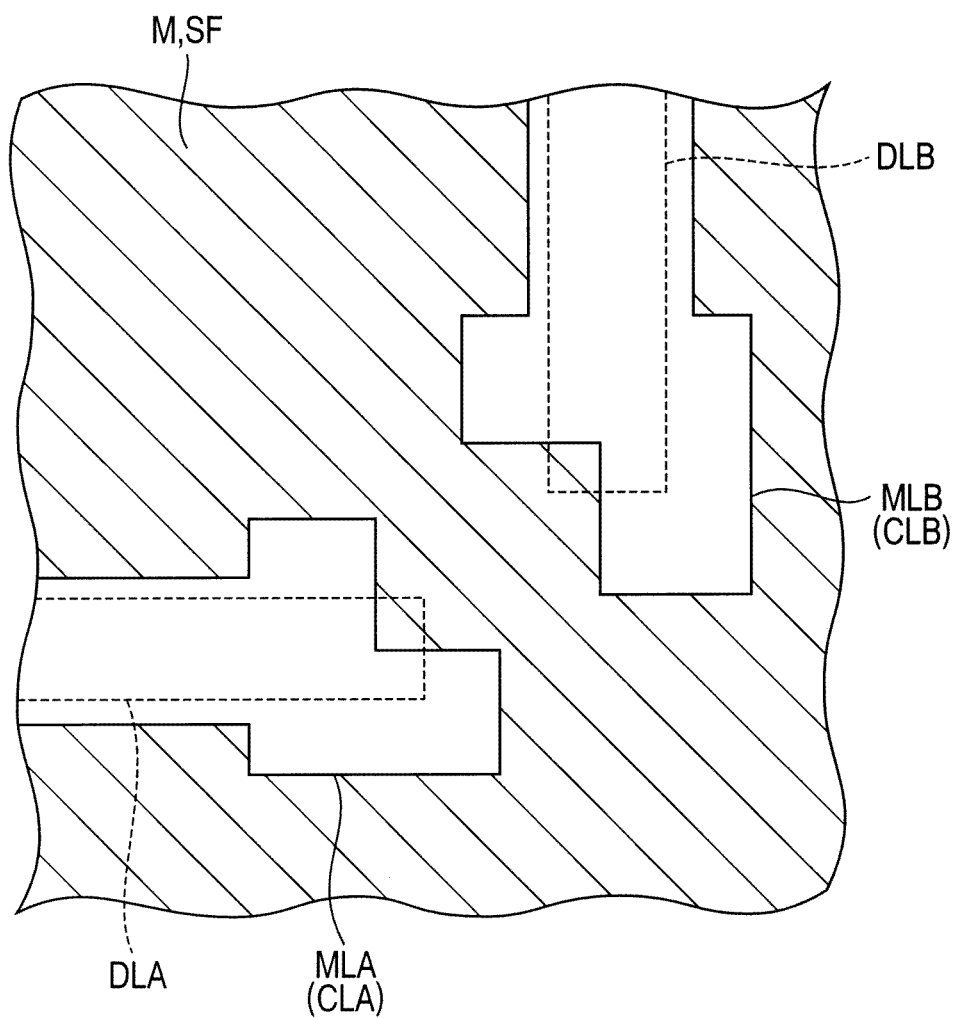
FIG. 20 is a plan view illustrating a photomask made based on data obtained from the step illustrated in FIG. 19 in the embodiment.
Figure 21:
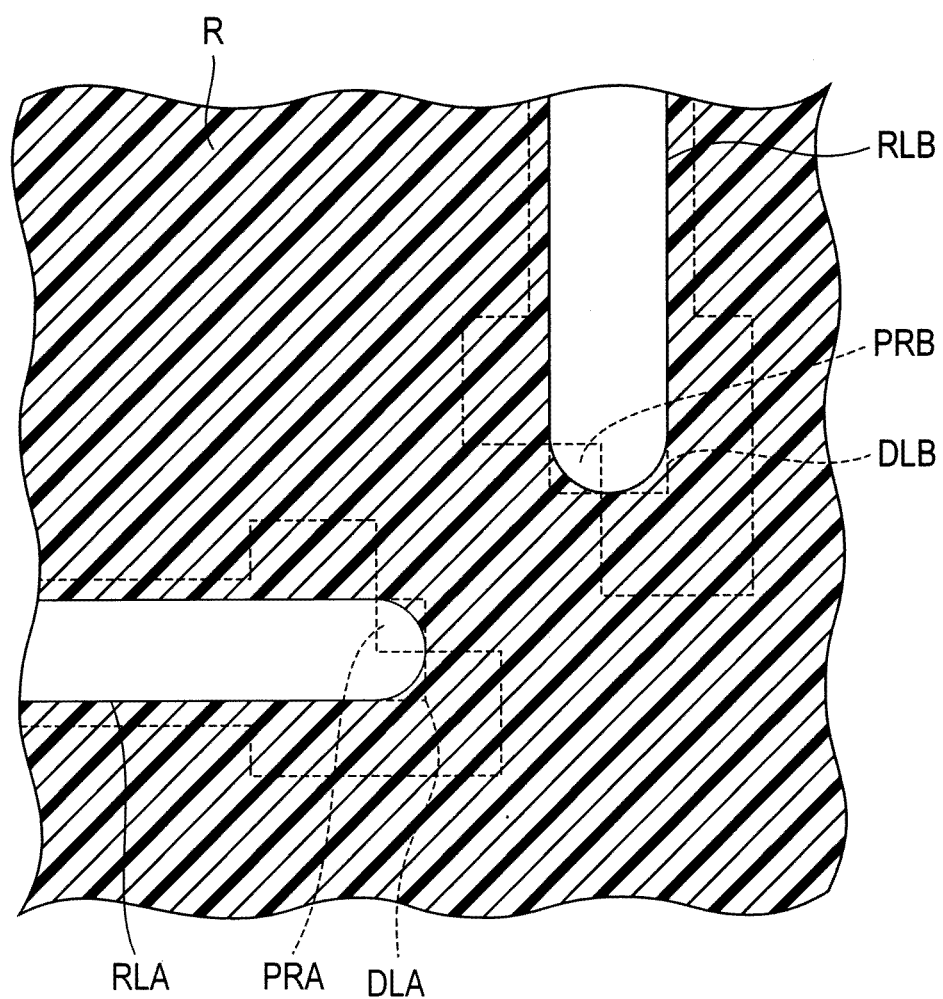
FIG. 21 is a plan view illustrating a resist pattern subjected to photoengraving and development using the photomask illustrated in FIG. 20 in the embodiment.

Subsequently, the light shield film is etched using the resist pattern as a mask. As a result, as illustrated in FIG. 20, a photomask M is manufactured. The photomask is obtained by forming a photomask line feature MLA corresponding to the corrected line feature CLA and a photomask line feature MLB corresponding to the corrected line feature CLB in the light shield film SF. Using the thus manufactured photomask M, resist applied to a semiconductor substrate is subjected to photoengraving and development. As illustrated in FIG. 21, consequently, a resist pattern RLA and a resist pattern RLB are formed in the resist (positive resist) R.

In the above-mentioned manufacturing method of a photomask, the following procedure is taken. Features that are close to each other and are estimated to violate a mask rule check after optical proximity correction is carried out are extracted. In these features, correction prohibited regions in which optical proximity correction is not carried out are set based on the arrangement relation between the patterns. Thereafter, optical proximity correction is carried out. Especially, in this case, the angle θ1 is 45° and thus the length in the X-axis direction and the length in the Y-axis direction of each of the correction prohibited regions PRA, PRB are set to an identical value. As a result, a photomask that makes it possible to obtain a target resist pattern (the patterning shape of a film to be processed over a semiconductor substrate) without violating a mask rule check can be obtained. In addition, since a desired resist pattern based on designed values is obtained, it is possible to ensure a sufficient depth of focus.

Fifth Embodiment

Figure 22:
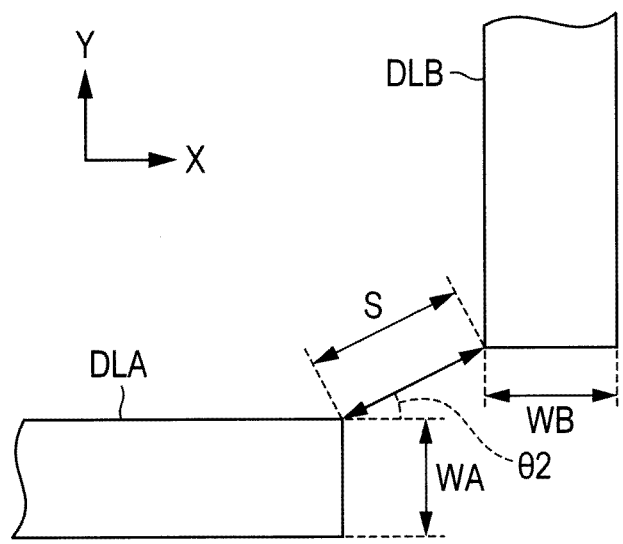
FIG. 22 is a plan view illustrating a step in a manufacturing method of a photomask to which a method for optical proximity correction in a fifth embodiment of the invention is applied.

Description will be given to a more concrete fourth example of the manufacturing method of a photomask. As illustrated in FIG. 22, it will be assumed that the followings are line features that are close to each other and estimated to violate a mask rule check when optical proximity correction is carried out: a line feature DLA, WA in width and a line feature DLB, WB in width. In addition, it will be assumed that the angle θ2 formed by a line segment connecting the corners closest to each other in the line feature DLA and the line feature DLB and the X-axis is smaller than 45°.

Figure 23:
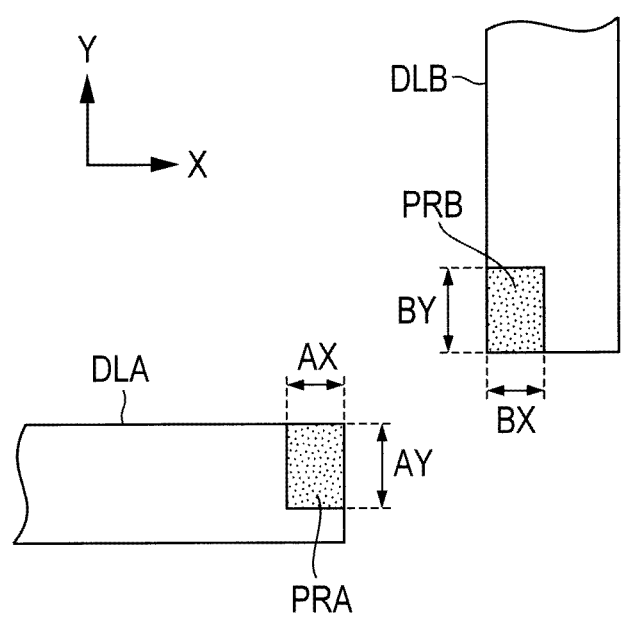
FIG. 23 is a plan view illustrating a step carried out after the step illustrated in FIG. 22 in the embodiment.

Subsequently, the distance S between the corners closest to each other in the line feature DLA and the line feature DLB is calculated. Further, a resolution Re (k1×λ/NA) is calculated based on the wavelength λ of the exposure light and the numerical aperture NA of an exposure device and a process-dependent parameter k1. Subsequently, for example, it is determined whether or not the distance S is not less than 50% of the resolution Re and not more than 300% thereof. When this condition is met, the following measure is taken as illustrated in FIG. 23: a correction prohibited region PRA is set in the line feature DLA and a correction prohibited region PRB is set in the line feature DLB.

The length in the X-axis direction and the length in the Y-axis direction of each of the correction prohibited regions PRA, PRB are determined based on the arrangement relation between the line feature DLA and the line feature DLB in the XY plane. Since the angle θ2 is smaller than 45°, in this case, the following measure is taken: the length AY in the Y-axis direction of the correction prohibited region PRA is set to a value larger than the length AX in the X-axis direction thereof; and the length BY in the Y-axis direction of the correction prohibited region PRB is set to a value larger than the length BX in the X-axis direction thereof.

Figure 24:
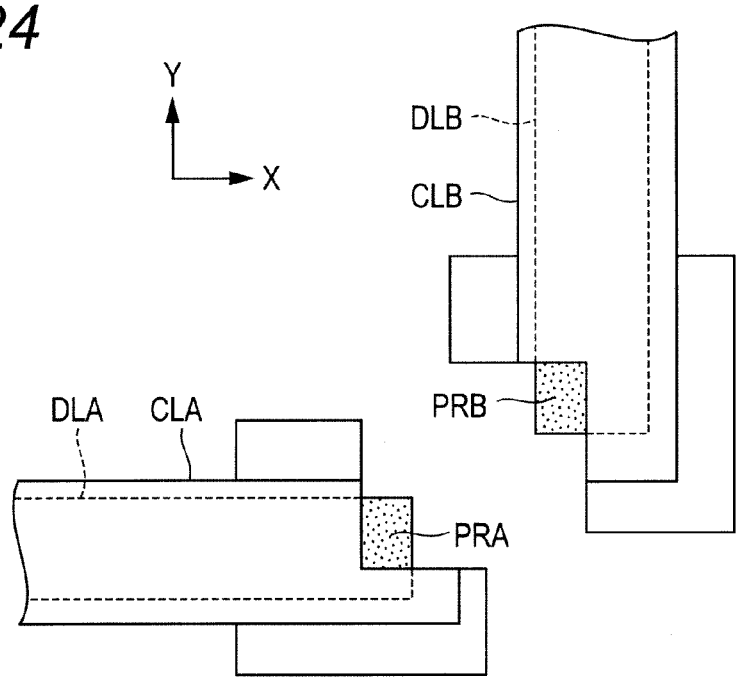
FIG. 24 is a plan view illustrating a step carried out after the step illustrated in FIG. 23 in the embodiment.

Subsequently, optical proximity correction is carried out on the line feature DLA and the line feature DLB with the correction prohibited regions PRA, PRB excluded. Then shape simulation for a resist pattern is carried out based on the line features that underwent the optical proximity correction. In model-based OPC, as mentioned above, the pattern deformation and the shape simulation for a resist pattern are repeated until a target resist pattern is obtained. Thus the following processing is carried out as illustrated in FIG. 24: with respect to the line feature DLA, a corrected line feature CLA is obtained with the correction prohibited region PRA excluded; and with respect to the line feature DLB, a corrected line feature CLB is obtained with the correction prohibited region PRB excluded.

Subsequently, a photomask is manufactured by carrying out electron beam lithography based on the data of the obtained corrected line feature CLA and the data of the obtained corrected line feature CLB. First, a resist film for electron beam exposure over a light shield film formed over the surface of a glass plate is scanned with an electron beam based on the data. A predetermined pattern containing the corrected line feature CLA and the corrected line feature CLB is thereby drawn. Subsequently, the resist film for electron beam exposure is subjected to predetermined development and a resist pattern corresponding to the corrected line feature CLA and the corrected line feature CLB is thereby formed.

Figure 25:
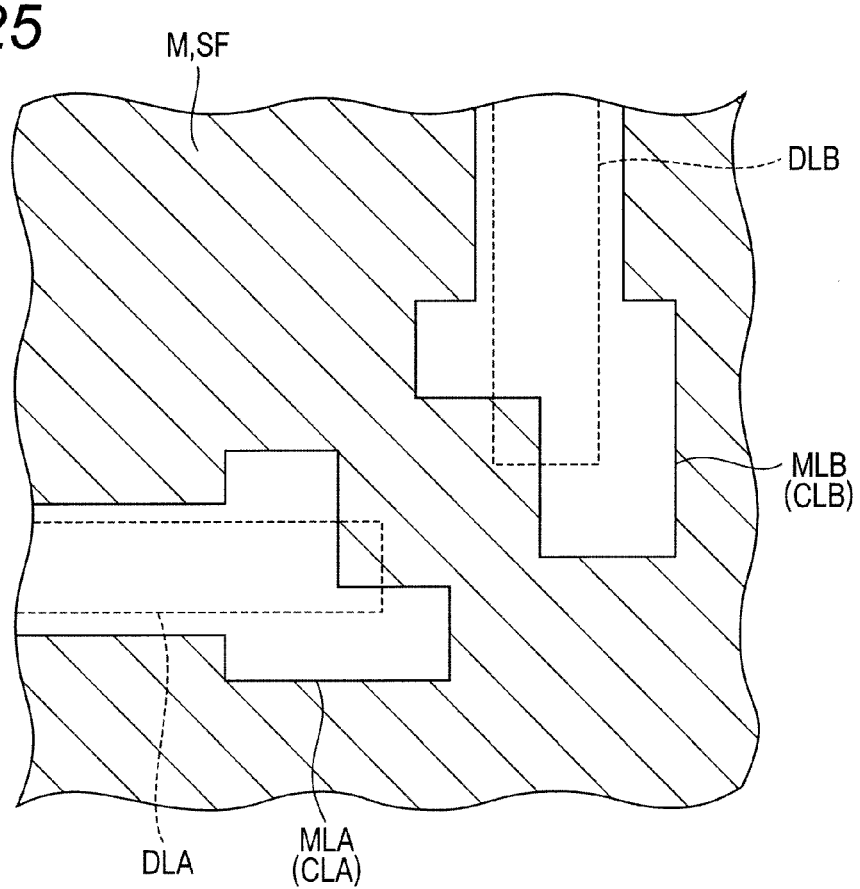
FIG. 25 is a plan view illustrating a photomask made based on data obtained from the step illustrated in FIG. 24 in the embodiment.
Figure 26:
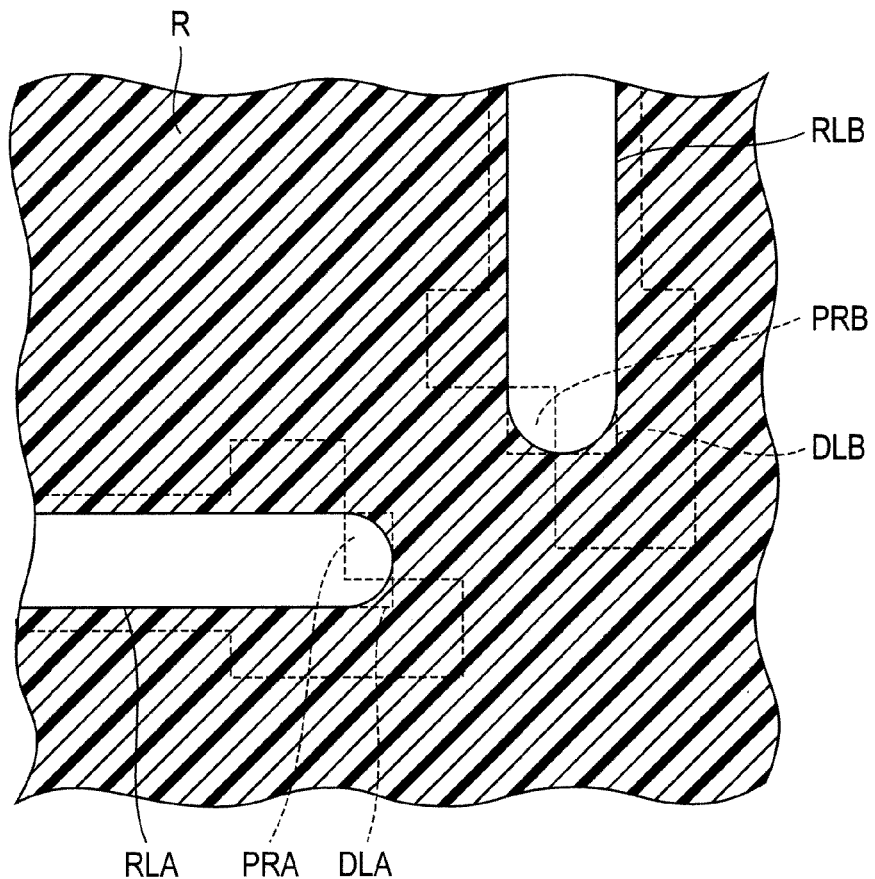
FIG. 26 is a plan view illustrating a resist pattern subjected to photoengraving and development using the photomask illustrated in FIG. 25 in the embodiment.

Subsequently, the light shield film is etched using the resist pattern as a mask. As a result, as illustrated in FIG. 25, a photomask M is manufactured. The photomask is obtained by forming a photomask line feature MLA corresponding to the corrected line feature CLA and a photomask line feature MLB corresponding to the corrected line feature CLB in the light shield film SF. Using the thus manufactured photomask M, resist applied to a semiconductor substrate is subjected to photoengraving and development. As illustrated in FIG. 26, consequently, a resist pattern RLA and a resist pattern RLB are formed in the resist (positive resist) R.

In the above-mentioned manufacturing method of a photomask, the following procedure is taken. Features that are close to each other and are estimated to violate a mask rule check after optical proximity correction is carried out are extracted. In these features, correction prohibited regions in which optical proximity correction is not carried out are set based on the arrangement relation between the features. Thereafter, optical proximity correction is carried out. Especially, in this case, the angle θ2 is smaller than 45° and thus the length in the Y-axis direction of each of the correction prohibited regions PRA, PRB is set to a value larger than the length in the X-axis direction thereof. As a result, a photomask that makes it possible to obtain a target resist pattern (the patterning shape of a film to be processed over a semiconductor substrate) without violating a mask rule check can be obtained. In addition, since a desired resist pattern based on designed values is obtained, it is possible to ensure a sufficient depth of focus.

Sixth Embodiment

Figure 27:
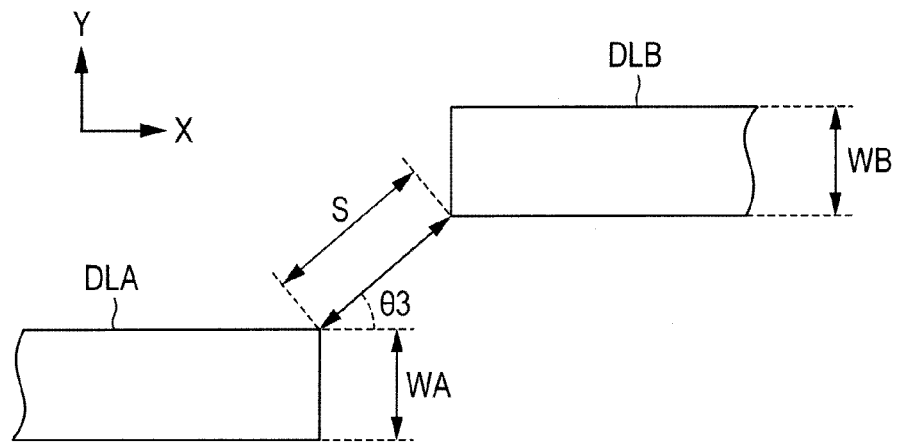
FIG. 27 is a plan view illustrating a step in a manufacturing method of a photomask to which a method for optical proximity correction in a sixth embodiment of the invention is applied.

Description will be given to a more concrete fifth example of the manufacturing method of a photomask. As illustrated in FIG. 27, it will be assumed that the followings are line features that are close to each other and estimated to violate a mask rule check when optical proximity correction is carried out: a line feature DLA, WA in width and a line feature DLB, WB in width. In addition, it will be assumed that the angle θ3 formed by a line segment connecting the corners closest to each other in the line feature DLA and the line feature DLB and the X-axis is smaller than 45°.

Figure 28:
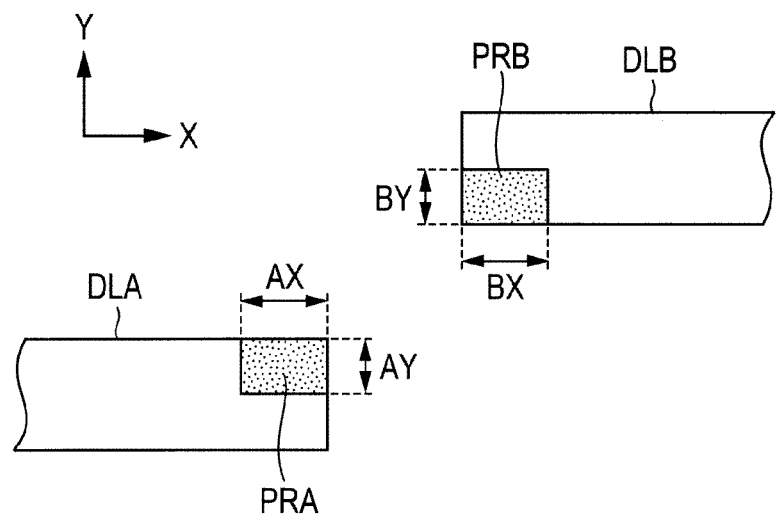
FIG. 28 is a plan view illustrating a step carried out after the step illustrated in FIG. 27 in the embodiment.

Subsequently, the distance S between the corners closest to each other in the line feature DLA and the line feature DLB is calculated. Further, a resolution Re (k1×λ/NA) is calculated based on the wavelength λ of the exposure light and the numerical aperture NA of an exposure device and a process-dependent parameter k1. Subsequently, for example, it is determined whether or not the distance S is not less than 50% of the resolution Re and not more than 300% thereof. When this condition is met, the following measure is taken as illustrated in FIG. 28: a correction prohibited region PRA is set in the line feature DLA and a correction prohibited region PRB is set in the line feature DLB.

The length in the X-axis direction and the length in the Y-axis direction of each of the correction prohibited regions PRA, PRB are determined based on the arrangement relation between the line feature DLA and the line feature DLB in the XY plane. In this case, the angle θ3 is smaller then 45° and both the line feature DLA and the line feature DLB are arranged in parallel with the X-axis. Therefore, the length AX in the X-axis direction of the correction prohibited region PRA is set to a value larger than the length AY in the Y-axis direction thereof. The length BX in the X-axis direction of the correction prohibited region PRB is set to a value larger than the length BY in the Y-axis direction thereof.

Figure 29:
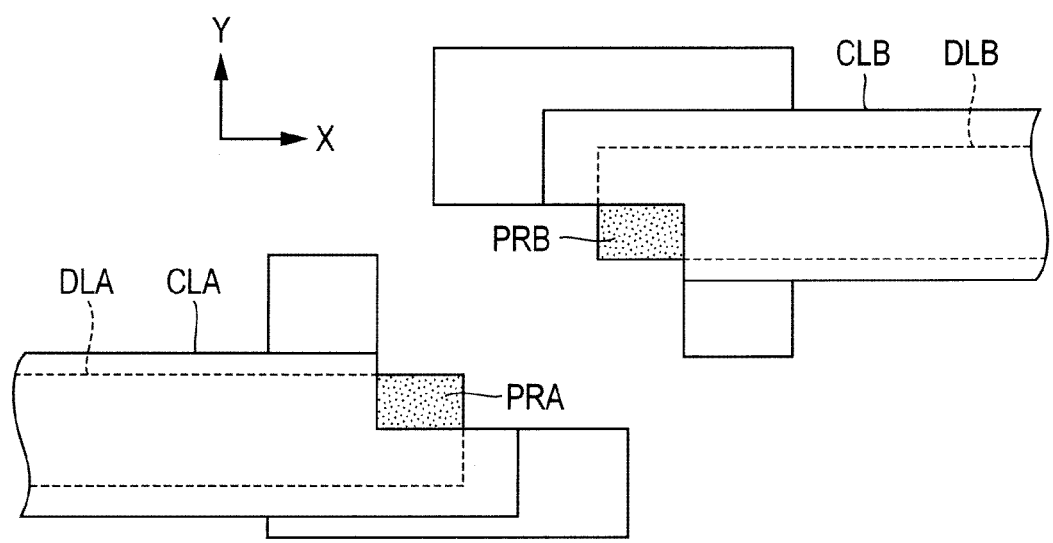
FIG. 29 is a plan view illustrating a step carried out after the step illustrated in FIG. 28 in the embodiment.

Subsequently, optical proximity correction is carried out on the line feature DLA and the line feature DLB with the correction prohibited regions PRA, PRB excluded. Then shape simulation for a resist pattern is carried out based on the line features that underwent the optical proximity correction. In model-based OPC, as mentioned above, the pattern deformation and the shape simulation for a resist pattern are repeated until a target resist pattern is obtained. Thus the following processing is carried out as illustrated in FIG. 29: with respect to the line feature DLA, a corrected line feature CLA is obtained with the correction prohibited region PRA excluded; and with respect to the line feature DLB, a corrected line feature CLB is obtained with the correction prohibited region PRB excluded.

Subsequently, a photomask is manufactured by carrying out electron beam lithography based on the data of the obtained corrected line feature CLA and the data of the obtained corrected line feature CLB. First, a resist film for electron beam exposure over a light shield film formed over the surface of a glass plate is scanned with an electron beam based on the data. A predetermined pattern containing the corrected line pattern CLA and the corrected line pattern CLB is thereby drawn. Subsequently, the resist film for electron beam exposure is subjected to predetermined development and a resist pattern corresponding to the corrected line feature CLA and the corrected line feature CLB is thereby formed.

Figure 30:
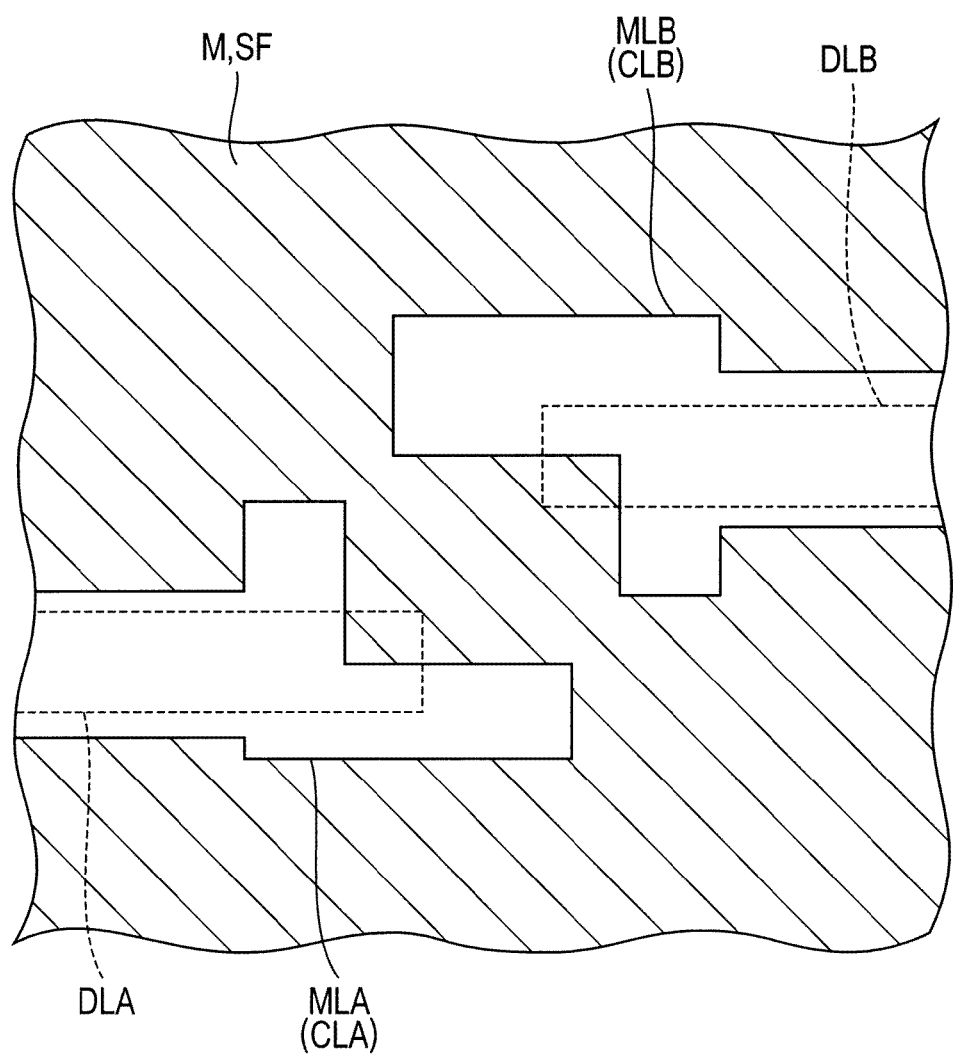
FIG. 30 is a plan view illustrating a photomask made based on data obtained from the step illustrated in FIG. 29 in the embodiment.
Figure 31:
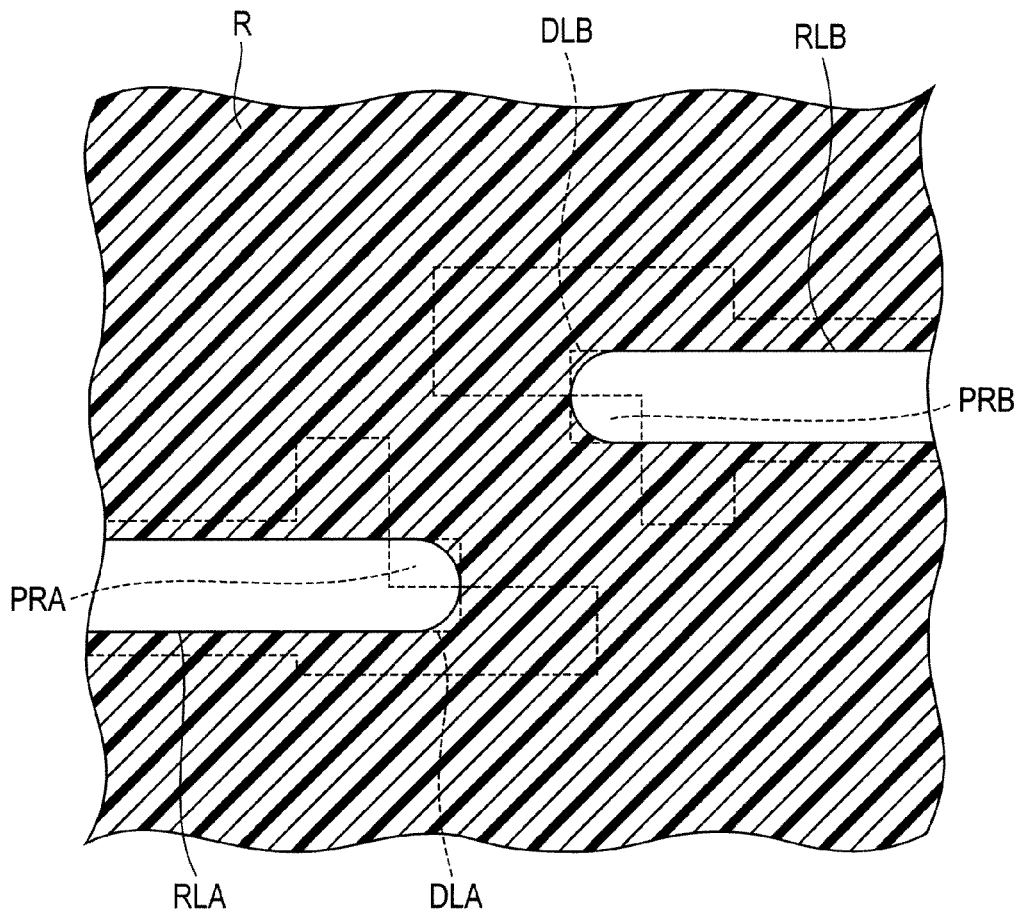
FIG. 31 is a plan view illustrating a resist pattern subjected to photoengraving and development using the photomask illustrated in FIG. 30 in the embodiment.

Subsequently, the light shield film is etched using the resist pattern as a mask. As a result, as illustrated in FIG. 30, a photomask M is manufactured. The photomask is obtained by forming a photomask line feature MLA corresponding to the corrected line feature CLA and a photomask line feature MLB corresponding to the corrected line feature CLB in the light shield film SF. Using the thus manufactured photomask M, resist applied to a semiconductor substrate is subjected to photoengraving and development. As illustrated in FIG. 31, consequently, a resist pattern RLA and a resist pattern RLB are formed in the resist (positive resist) R.

In the above-mentioned manufacturing method of a photomask, the following procedure is taken. Features that are close to each other and are estimated to violate a mask rule check after optical proximity correction is carried out are extracted. In these features, correction prohibited regions in which optical proximity correction is not carried out are set based on the arrangement relation between the features. Thereafter, optical proximity correction is carried out. Especially, in this case, the angle θ3 is smaller than 45° and both the line feature DLA and the line feature DLB are arranged in parallel with the X-axis. Therefore, the length AX in the X-axis direction of the correction prohibited region PRA is set to a value larger than the length AY in the Y-axis direction thereof. In addition, the length BX in the X-axis direction of the correction prohibited region PRB is set to a value larger than the length BY in the Y-axis direction thereof. As a result, a photomask that makes it possible to obtain a target resist pattern (the patterning shape of a film to be processed over a semiconductor substrate) with designed values without violating a mask rule check can be obtained. In addition, since a desired resist pattern based on designed values is obtained, it is possible to ensure a sufficient depth of focus.

The above-mentioned photomasks (FIG. 20, FIG. 25, FIG. 30) containing each line feature can be used, for example, when a wiring groove or the like for forming copper wiring is formed by a damascene method. Meanwhile, the photomasks obtained by patterning a light shield film so that portions where the light shield film is left and portions where it is removed are inverted with respect to the photomasks illustrated in FIG. 20, FIG. 25, and FIG. 30 are also used. These photomasks can be used to form, for example gate wiring or the like.

In the description of each of the above embodiments, the conditions for determining whether to set correction prohibited regions PRA, PRB are just an example; and they are set to appropriate values according to the manufacturing process or the like for each photomask. In the description of each of the above embodiments, the following cases have been taken as examples: cases where after correction prohibited regions PRA, PRB are set, corrected hole features CHA, CHB or corrected line features CLA, CLB are obtained based on model-based OPC. Instead, corrected hole features or corrected line features may be obtained by correcting data by a preset amount of correction by rule-based OPC.

Seventh Embodiment

Figure 32:
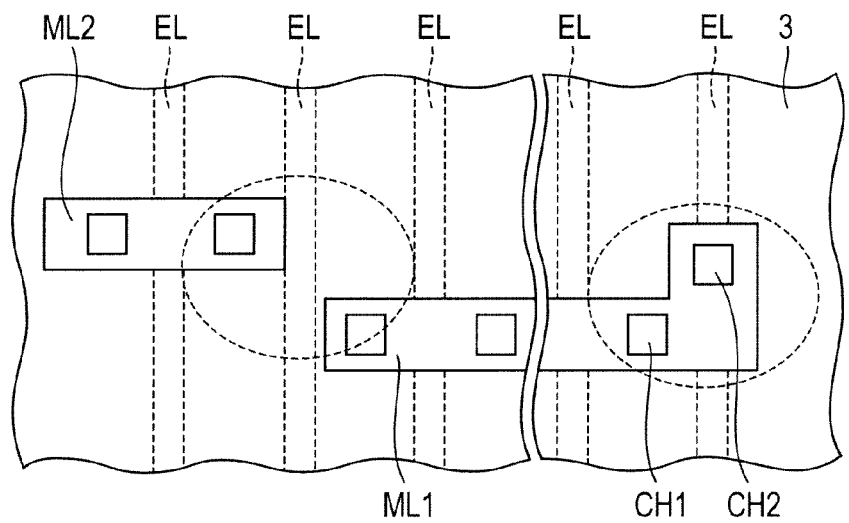
FIG. 32 is a plan view explaining a manufacturing method of a semiconductor device to which a photomask in a seventh embodiment of the invention is applied.

Description will be given to an example of the manufacturing method of a semiconductor device to which the above-mentioned photomasks is applied based on the planar layout (designed values) of the semiconductor device illustrated in FIG. 32. A photomask containing hole features is applied to the patterning of resist to form openings in an interlayer insulating film when contact plugs CH1, CH2 close to each other, shown in the broken line frame on the right of the drawing, are formed.

Figure 33:
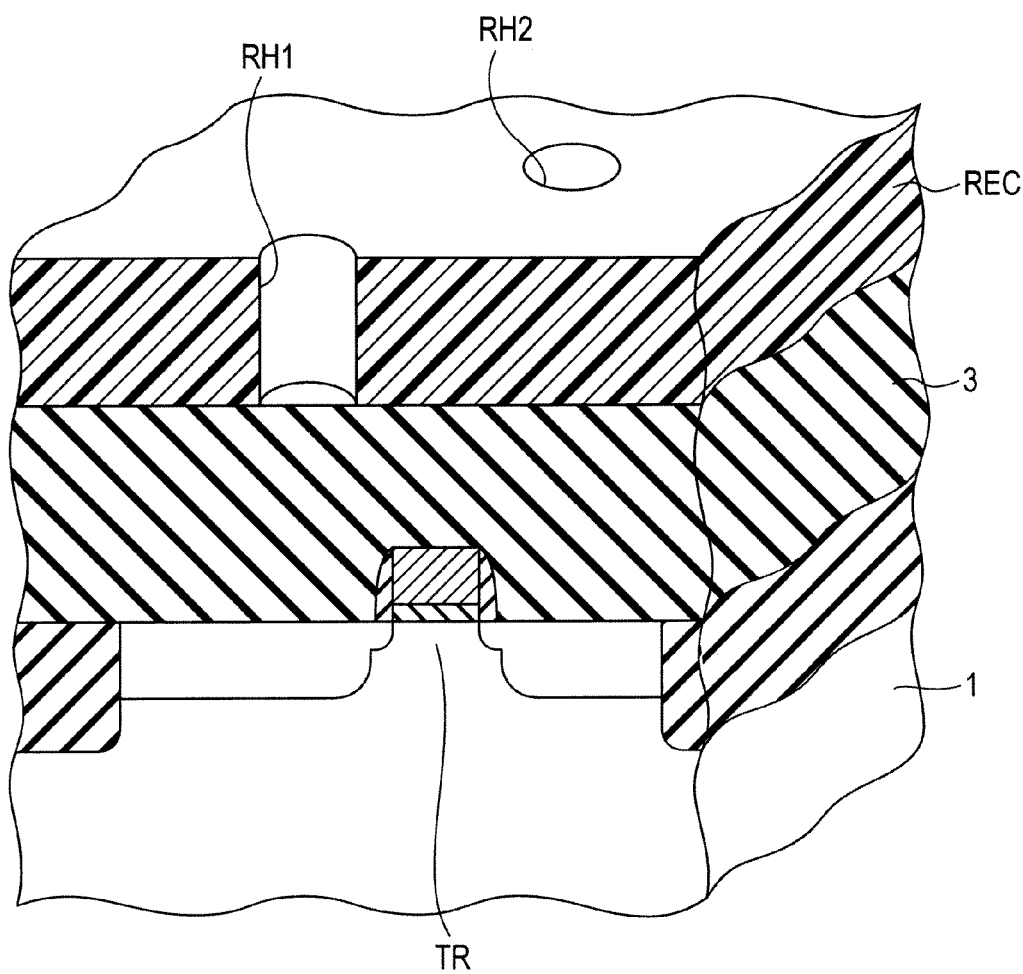
FIG. 33 is a partial sectional perspective view illustrating a step in the manufacturing method of a semiconductor device illustrated in FIG. 32 in the embodiment.

In this case, resist (positive resist) REC is applied to the surface of an interlayer insulating film 3 covering a transistor TR and the like placed over the surface of a semiconductor substrate 1 as illustrated in FIG. 33. This resist REC is subjected to photoengraving using the above-mentioned photomask containing hole features and then development is carried out. As a result, a resist pattern RH1 and a resist pattern RH2 close to each other are formed in the resist REC. Thereafter, using the resist REC as a mask, the interlayer insulating film 3 is subjected to anisotropic etching to form openings (not shown). These openings are filled with a predetermined conductive member and the contact plugs CH1, CH2 are thereby formed.

Figure 34:
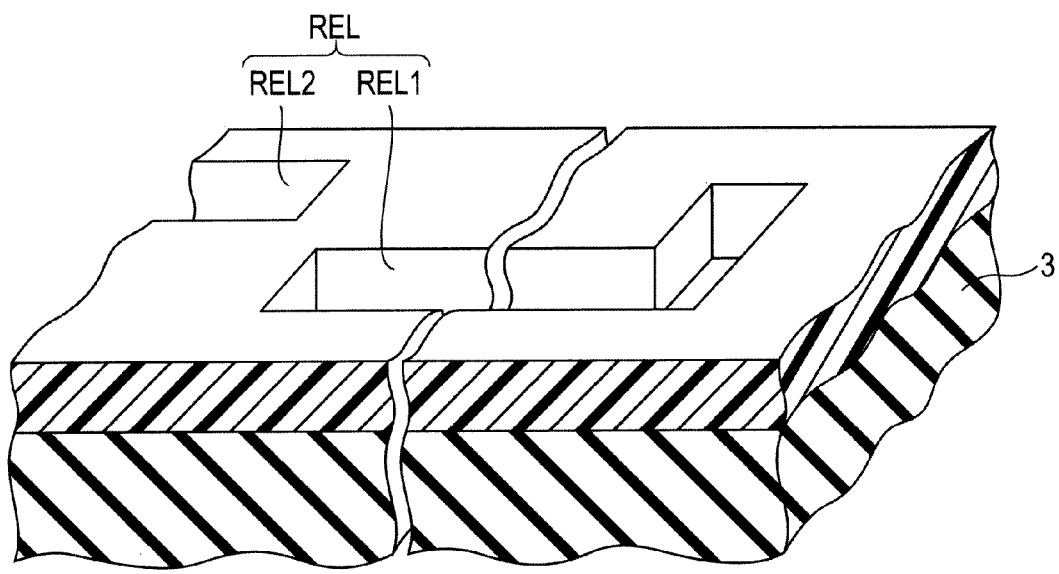
FIG. 34 is a partial sectional perspective view illustrating another step in the manufacturing method of a semiconductor device illustrated in FIG. 32 in the embodiment.

Meanwhile, a photomask containing line features is applied to the patterning of resist to form wiring grooves in the interlayer insulating film when wirings ML1, ML2 close to each other are formed. In this case, the resist (positive resist) REC covering the interlayer insulating film 3 is subjected to photoengraving using the above-mentioned photomask (Refer to FIG. 30) containing line features as illustrated in FIG. 34 and then development is carried out. As a result, a resist pattern REL1 and a resist pattern REL2 close to each other are formed as open patterns (cutout patterns) in the resist REL.

Thereafter, using the resist REL as a mask, the interlayer insulating film 3 is subjected to anisotropic etching to form wiring grooves (not shown). A copper film or the like is so formed as to fill these wiring grooves and the copper films are subjected to chemical mechanical polishing. As a result, the wirings ML1, ML2 are formed.

Figure 35:
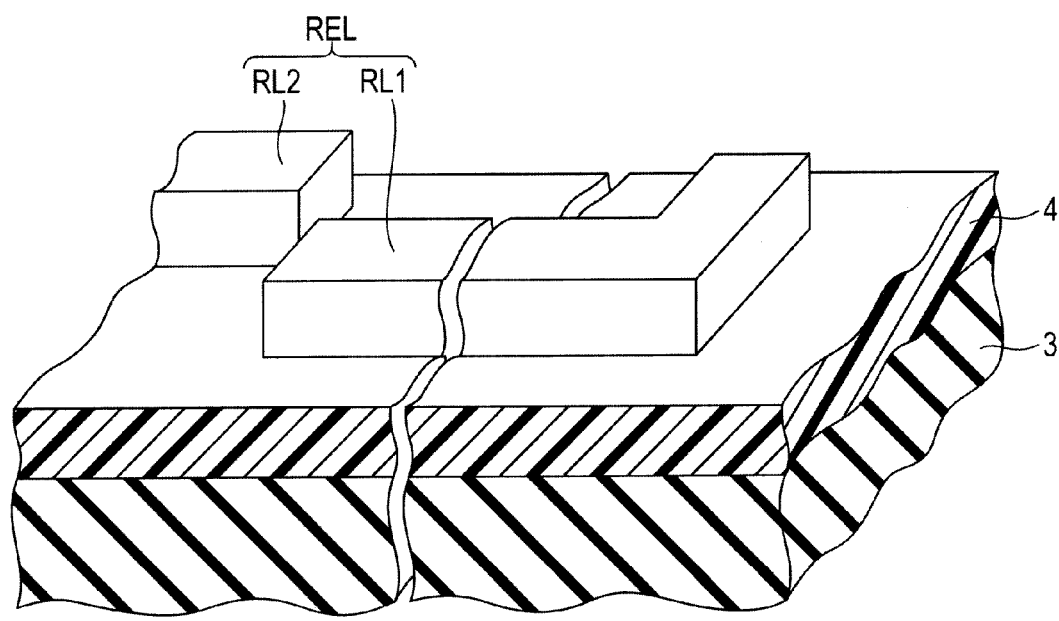
FIG. 35 is a partial sectional perspective view illustrating further another step in the manufacturing method of a semiconductor device illustrated in FIG. 32 in the embodiment.

As a photomask containing line features, the following photomask may be used to carry out photoengraving and development: a photomask obtained by patterning a light shield film so that portions where the light shield film is left and portions where it is removed are inverted with respect to the photomask illustrated in each of FIG. 20, FIG. 25, and FIG. 30. In this case, resist patterns RL1, RL2 arising from linearly left resist are formed in the resist REL applied to the surface of the conductive film 4 as illustrated in FIG. 35. Thereafter, using the resist REL as a mask, the conductive film 4 is subjected to anisotropic etching and the wirings ML1, ML2 are thereby formed. The photomasks containing line features in such a mode can be applied when the electrode wirings EL illustrated in FIG. 32 are formed.

In the manufacturing method of a semiconductor device to which the above-mentioned photomasks are applied, a desired resist pattern based on designed values can be obtained and thus it is possible to ensure a depth of focus. As a result, the margin in photoengraving can be enhanced regardless of any variation, such as a step in a base material, from process to process.

The embodiments disclosed here are just examples and the invention is not limited to them. The invention is shown by WHAT IS CLAIMED IS, not by the above description, and it is intended to include every modification within the meaning and scope equivalent to claims.

The invention is effectively utilized to manufacture a photomask containing hole features or line features and the manufacture of a semiconductor device using this photomask.

What is claimed is:

1. A manufacturing method of a photomask for photoengraving predetermined patterns in a photosensitive material film over a semiconductor substrate, the method comprising the steps of:

in a desired pattern with designed values, extracting proximity design features that are close to each other and will brought closer to each other when optical proximity correction is carried out, and are estimated not to be stably resolved as a photomask pattern and to violate a mask rule check;

in the proximity design features, setting correction prohibited regions where optical proximity correction is not carried out, based on the distance between the features obtained from the extracted proximity design features and a resolution obtained from the wavelength of the exposure light and the numerical aperture of an exposure device;

carrying out optical proximity correction on the proximity design features with the correction prohibited regions excluded to obtain corrected proximity patterns; and carrying out electron beam lithography based on the corrected proximity patterns and thereby patterning a predetermined mask material.

2. The manufacturing method of a photomask according to claim 1, wherein at the step of obtaining the corrected proximity patterns, optical proximity correction is carried out with a resist pattern obtained when optical proximity correction is carried out on a feature with the designed values before the correction prohibited regions are set taken as a target.

3. The manufacturing method of a photomask according to claim 1, wherein at the step of setting the correction prohibited regions, on the assumption that the feature with the designed values is placed in the XY plane formed by the X-axis and the Y-axis orthogonal to each other, the length in the X-axis direction and the length in the Y-axis direction of each of the correction prohibited regions are set based on the arrangement relation between the proximity design features in the XY plane.

4. The manufacturing method of a photomask according to claim 1, wherein at the step of obtaining the corrected proximity patterns, a step of carrying out pattern deformation on the proximity design features by optical proximity correction and a step of obtaining a resist shape pattern estimated when the pattern deformation is carried out are repeated until a desired resist pattern is obtained.

5. The manufacturing method of a photomask according to claim 1, wherein at the step of obtaining the corrected proximity patterns, the proximity design features are corrected by a preset amount based on the size of the patterns.

* * * * *